(12) United States Patent
Ohno et al.

(10) Patent No.: US 6,897,484 B2
(45) Date of Patent: May 24, 2005

(54) NITRIDE SEMICONDUCTOR LIGHT EMITTING ELEMENT AND MANUFACTURING METHOD THEREOF

(75) Inventors: Tomoki Ohno, Pittsburgh, PA (US); Shigetoshi Ito, Ikoma (JP)

(73) Assignee: Sharp Kabushiki Kaisha, Osaka (JP)

(*) Notice: Subject to any disclaimer, the term of this patent is extended or adjusted under 35 U.S.C. 154(b) by 0 days.

(21) Appl. No.: 10/666,805

(22) Filed: Sep. 19, 2003

(65) Prior Publication Data

US 2004/0056242 A1 Mar. 25, 2004

(30) Foreign Application Priority Data

Sep. 20, 2002 (JP) .......................... 2002-275352
Nov. 20, 2002 (JP) .......................... 2002-336588

(51) Int. Cl.$^7$ ............................. H01A 29/26
(52) U.S. Cl. ...................... 257/79; 257/86; 438/22; 438/46
(58) Field of Search .................. 257/79, 86, 94; 438/22, 46, 47

(56) References Cited

U.S. PATENT DOCUMENTS 6,493,367 B1  12/2002  Ito et al.
6,593,595 B2   7/2003  Ono et al.
6,735,231 B2   5/2004  Ono et al.

FOREIGN PATENT DOCUMENTS

| JP | 08-228025   | 9/1996  |
| JP | 09-191160   | 7/1997  |
| JP | 09-266327   | 10/1997 |
| JP | 11-330614   | 11/1999 |
| JP | 2001-085796 | 3/2001  |
| JP | 2002-151786 | 5/2002  |
| JP | 2002-246686 | 8/2002  |

*Primary Examiner*—Eddie Lee
*Assistant Examiner*—Douglas W. Owens
(74) *Attorney, Agent, or Firm*—Morrison & Foerster LLP

(57) ABSTRACT

The object of the present invention is to lower the oscillation threshold value and to improve the yield by improving the luminous efficiency in the central wavelength of a laser. To achieve the object, the nitride semiconductor light emitting element of the present invention includes a substrate, a lower clad layer formed of a nitride semiconductor containing Al and Ga formed thereon, a lower guide layer formed of a nitride semiconductor mainly containing In and Ga formed thereon, and an active layer including a nitride semiconductor mainly containing In and Ga formed thereon. The lower guide layer has a first layer and a second layer higher in In content than the first layer, successively stacked from the active layer side.

31 Claims, 21 Drawing Sheets

NITRIDE SEMICONDUCTOR LIGHT EMITTING ELEMENT AND MANUFACTURING METHOD THEREOF

BACKGROUND OF THE INVENTION

1. Field of the Invention

The present invention relates to a nitride semiconductor light emitting element with improved luminous efficiency of an active layer, and a method for manufacturing the same. The present invention further relates to a self-pulsating nitride semiconductor light emitting element and a method for manufacturing the same.

2. Description of the Related Art

A nitride semiconductor light emitting element has an oscillation wavelength of approximately 400 nm, and it has been developed for an optical disk system. Further, since it can withstand up to high output, its application is widely studied in the fields such as a high-power light source, a pulse oscillator and the like. To be used in various applications, the important issue is to lower the oscillation threshold value. Thus, various improvements, such as improvement of the substrate, the epitaxial growth technique, the multiple quantum well active layer and the like have been introduced. For example, Japanese Patent Laying-Open No. 8-228025 discloses a semiconductor light emitting element having a structure shown in FIG. 14 as a conventional improved nitride semiconductor light emitting element.

As shown in FIG. 14, the light emitting element has a structure in which a buffer layer 452, an n-type contact layer 453, a second n-type clad layer 454, a first n-type clad layer 455, an active layer 456, a first p-type clad layer 457, a second p-type clad layer 458, and a p-type contact layer 459 are successively stacked on a sapphire substrate 451. By providing first n-type clad layer 455 or first p-type clad layer 457, the crystallinity of active layer 456 is improved to attain higher luminous efficiency.

However, some characteristics can be found when the nitride semiconductor light emitting element according to the conventional technique is operated at most at the oscillation threshold value to observe the emission spectrum from the backside of the wafer with a spot size of several $\mu$m. When measurement is made with different spot positions in a laser resonator, the wavelength that attains the maximum intensity varies and often the full width at half maximum of the emission spectrum is found to be wide or a sub peak is observed in the long-wavelength region of at least 440 nm. Such an nitride semiconductor light emitting element is higher in oscillation threshold value due to lower stimulated emission probability, as compared to a nitride semiconductor light emitting element having a unimodal emission spectrum with narrow full width at half maximum.

Further, Japanese Patent Laying-Open Nos. 8-228025, 9-266327 and 11-330614 already disclose light emitting elements in which a conventional n-guide layer formed of a nitride semiconductor containing In and Ga is provided to suppress degradation of crystallinity, which may be observed when an active layer formed of InGaN is provided on a layer formed of GaN or AlGaN. However, the inventors of the present invention have thoroughly studied these structures and found that they do not provide satisfactory effect.

When a nitride semiconductor laser is used as a light source for an optical disk system or the like, a problem associated therewith is an optical feedback noise resulting from a light being reflected at the disk surface and coupled again with the semiconductor laser. Generally, it is known to lower the coherence by bringing the carrier density of the semiconductor laser into a transient state to alleviate the gain concentration of the oscillation spectrum. To this end, the high-frequency superposition for modulating the injection current, or the self-pulsation using the interaction of carriers and photons in the semiconductor laser may be carried out. Specifically, the self-pulsation is more advantageous in the viewpoint of cost and ease of use, since it does not require to use high-frequency circuitry.

Such a self-pulsating nitride semiconductor laser is disclosed, for example, in Japanese Patent Laying-Open No. 9-191160. This laser is a low-noise semiconductor laser for an optical disk shown in FIG. 21, which serves as a stable low-noise semiconductor laser by including a saturable absorption layer having InGaN as a constituent element. The structure of the nitride semiconductor laser is as follows. Referring to FIG. 21, an n-type AlN layer 701, an n-type AlGaN clad layer 702, an n-type GaN light guide layer 703, an InGaN quantum well active layer 704, a p-type GaN light guide layer 705, a p-type AlGaN clad layer 706, a p-type GaN contact layer 707 are successively stacked on an n-type SiC substrate 700. Additionally, p-type GaN light guide layer 705 is provided with an InGaN saturable absorption layer 708.

Further, Japanese Patent Laying-Open No. 9-191160 discloses that an InGaN saturable absorption layer may be provided to n-type GaN guide layer 703. Generally in a nitride semiconductor laser, a layer between a substrate and an active layer (hereinafter referred to as "an active layer lower layer") is n-type while an active layer upper layer is p-type. A saturable absorption layer includes an n-type saturable absorption layer provided in an n-type layer and p-type saturable absorption layer provided in a p-type layer.

The nitride semiconductor laser is formed of a clad layer mainly containing Al and Ga and an active layer mainly containing In and Ga, while the saturable absorption layer that absorbs laser light is also formed of a layer mainly containing In and Ga. The layer containing Al and Ga, or the layer mainly containing Ga is higher in the growth temperature than the layer mainly containing In and Ga by at least 100° C. normally, and in some cases by nearly 300° C. Therefore, it has characteristics that the temperature during a sequence of epitaxial growth varies greatly. Since such temperature varie may degrade the state of the active layer and promote segregation of In, the growth procedure must be carried out carefully when providing the saturable absorption layer.

When In segregation of the active layer occurs, self-pulsation is hindered since gain is aggravated. Further, with the conventional structure, self-pulsation may partially be hindered, or the light output in which self-pulsation is observed may not be stable. Still further, with the structure of Japanese Patent Laying-Open No. 9-191160 also, an adverse effect due to thermal hysteresis tends to occur since the GaN layer or the AlGaN layer is provided between the InGaN active layer and the InGaN saturable absorption layer.

SUMMARY OF THE INVENTION

An object of the present invention is to lower the oscillation threshold value and to improve the yield by improving the luminous efficiency in the central wavelength of a laser, and to provide a nitride semiconductor light emitting element with stable light output and excellent self-pulsation characteristics.

To achieve the object, a nitride semiconductor light emitting element of the present invention includes a substrate, a lower clad layer formed of a nitride semiconductor containing Al and Ga provided thereon, a lower guide layer formed of a nitride semiconductor mainly containing In and Ga provided thereon, and an active layer including a nitride semiconductor mainly containing In and Ga provided thereon. The lower guide layer has a first layer and a second layer higher in In content than the first layer, successively stacked from the active layer side, in which the second layer preferably functions as a saturable absorption layer.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 1A and 1B show a nitride semiconductor light emitting element according to a first embodiment of the present invention, wherein FIG. 1A is a cross sectional view of the nitride semiconductor light emitting element seen from the direction of a resonator, and FIG. 1B is a schematic diagram showing the energy level of each layer;

FIGS. 7A and 7B show a nitride semiconductor light emitting element according to a third embodiment of the present invention, wherein FIG. 7A is a cross sectional view of the nitride semiconductor light emitting element seen from the direction of a resonator, and FIG. 7B is a schematic diagram showing the energy level of each layer;

FIGS. 8A–11B show a nitride semiconductor light emitting element according to a fourth embodiment of the present invention, wherein FIGS. 8A, 9A, 10A and 11A are cross sectional views of the nitride semiconductor light emitting element seen from the direction of a resonator, and FIGS. 8B, 9B, 10B and 11B are schematic diagrams showing the energy level of each layer;

FIGS. 12A and 12B show a nitride semiconductor light emitting element according to a fifth embodiment of the present invention, wherein FIG. 12A is a cross sectional view of the nitride semiconductor light emitting element seen from the direction of a resonator, and FIG. 12B is a schematic diagram showing the energy level of each layer;

FIGS. 13A and 13B show a nitride semiconductor light emitting element according to a sixth embodiment of the present invention, wherein FIG. 13A is a cross sectional view of the nitride semiconductor light emitting element seen from the direction of a resonator, and FIG. 13B is a schematic diagram showing the energy level of each layer;

DESCRIPTION OF THE PREFERRED EMBODIMENTS

Figure 1A:
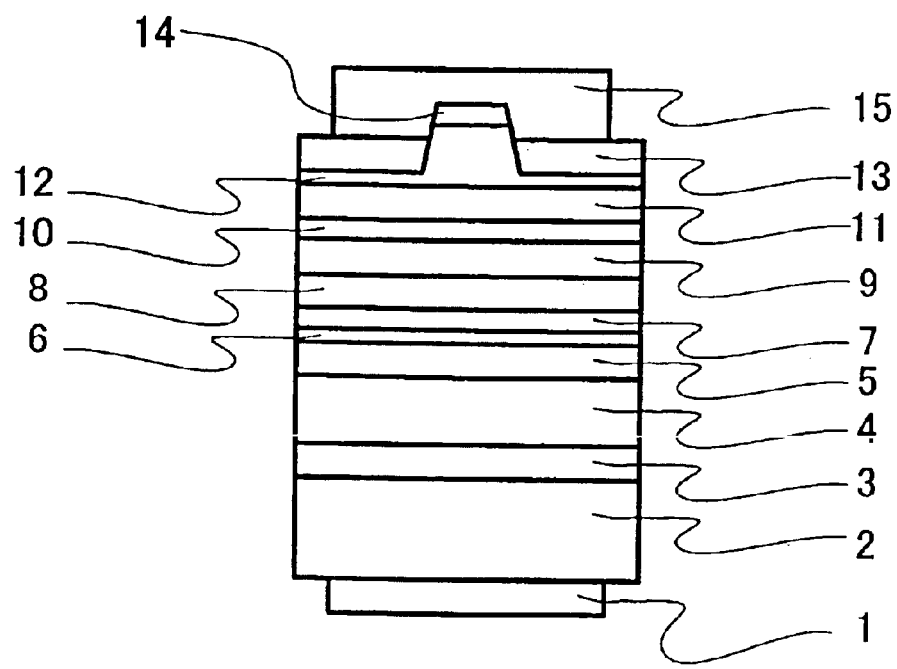

A nitride semiconductor light emitting element of the present invention is characterized in that a lower guide layer, which is stacked between a lower clad layer and an active layer, has a first layer and a second layer higher in In content than the first layer, stacked successively from the active layer side. As a result of studying the structure of the layers below the active layer, it has been found that the emission spectrum of the active layer can be made unimodal with narrower full width at half maximum and oscillation threshold value can be lowered, when a lower guide layer formed of a nitride semiconductor mainly containing In and Ga is provided between an n-clad layer and the active layer, in which the lower guide layer has a first layer and the second layer successively stacked from the active layer side, and in which the second layer is approximately equal to a well layer in the active layer in In content. The second layer may or may not be added with an n-type impurity.

When the second layer is positioned very close to the active layer, the second layer also functions as a light emitting layer, since part of carriers injected from a p-type electrode and an n-type electrode couple again at the second layer. Further, if the active layer and the second layer are different in substantial bandgap, stimulated emission probability of either of the two decreases. Even when they are approximately the same in the bandgap, the second layer is low in luminous efficiency affected by the ground layer, and additionally, oscillation threshold current rises as the volume of the light emitting layer increases. Accordingly, it is desirable that the second layer is distanced from the well layer at the substrate side in the active layer by at least 20 nm, so that holes injected from the p-type electrode do not enter therein.

The active layer mainly contains In and Ga, and the epitaxial growth temperature is approximately 650° C. to 850° C. Generally, the layer adjacent to the active layer is formed of a nitride semiconductor mainly containing Al and Ga, or Ga, and the epitaxial growth temperature is often at least 900° C. In the present invention also, the temperature of 1075° C. is employed. As used in the present specification, "mainly contain" means that, in a nitride semiconductor containing a described material, the described material constitutes at least 99% of the components other than nitride, and further, an impurity to be added may be different. For example, it means that at most 1% of Al may be mixed in the active layer. The active layer refers to a layer that directly contributes to light emission. It may refer to a layer having spreading of electrons in case of a quantum well, but it may include only a well layer or may include a barrier layer additionally, if not specifically stated. Still further, in a multiple quantum well formed with several quantum wells, it may refer to layers posed between well layers positioned in opposing ends, or it may refer to layers posed between barrier layers positioned in opposing ends.

In order for the active layer to obtain excellent light emitting characteristics, it is necessary to reduce the distortion resulted in the active layer from the difference in lattice constant between a layer formed of a nitride semiconductor mainly containing Ga, or Al and Ga, and an active layer formed of a nitride semiconductor mainly containing In and Ga, and the effect of variation in the temperature after the growth of the active layer, and the effect of thermal hysteresis. In order to reduce the distortion of the active layer, it is necessary to provide a lower guide layer serving as a buffer below the active layer, in which the lower guide layer is formed of a nitride semiconductor mainly containing In and Ga. Further, it is necessary to provide the lower guide layer with a second layer having In content close to the In content of a well layer in the active layer. After the growth of the active layer, a carrier block layer formed of a nitride semiconductor mainly containing Al and Ga (the Al content is at least 0.15, and desirably at least 0.2), a p-type guide layer mainly containing Ga, a p-type clad layer mainly containing Al and Ga, and p-type contact layer formed of a nitride semiconductor mainly containing Ga are provided. As these layers are often epitaxially grown at a temperature of at least 900° C., they considerably change the state of the active layer.

A nitride layer containing In such as the active layer tends to enter into a segregation state where In is energetically stable. Thus, the segregation may be adjusted largely by changing the growth speed of the active layer as appropriate to control the diffusion of In in the layer and by introducing an interruption during the growth. On the other hand, since the variation in the temperature after the growth of the active layer also change the segregation state of In in the active layer, specifically a step that fluctuates the growth temperature significantly not only hinders to maintain the characteristics of the active layer, but also degrades the characteristics of the active layer.

For example, after the growth of the carrier block layer, when providing a guide layer of p-type mainly containing In and Ga at the growth temperature of at least 650° C. and at most 850° C., at least one temperature drop and temperature rise occur after the growth of the active layer. It is very difficult to grow the active layer stably in the nitride semiconductor light emitting element thus manufactured, and the oscillation wavelength tends to vary among lots and in the same wafer, resulting in the reduction of the yield. Accordingly, it is desirable not to provide a layer that is grown in a low temperature growth process, specifically at most 830° C., after the temperature rising step subsequent to the growth of the active layer. When the layer is provided, it is necessary to be distanced from the active layer at least by 100 nm, approximately. Therefore, in the present specification, an asymmetric guide layer structure is employed in which a lower guide layer formed of a nitride semiconductor mainly containing In and Ga is provided in an n-type layer only. When photon distribution is biased, it is effective to provide a layer formed of a nitride semiconductor containing mainly In and Ga between the active layer and the carrier block layer.

On a GaN substrate, an n-type clad layer formed of a nitride semiconductor mainly containing Al and Ga is formed, and an n-type guide layer formed of a nitride semiconductor mainly containing Ga is further stacked thereon by a few tens of nm (note that this n-type guide layer may be omitted). Thereafter, after lowering the growth temperature approximately to 730° C., a second layer including a nitride layer mainly containing In and Ga is provided. The growth temperature of the second layer is desirably 650° C. to 830° C., approximately. Here, the substrate is not limited to GaN, and it may be sapphire, SiC, GaAs, Si, $ZrB_2$ and the like. If these types of substrates are employed, an appropriate nitride layer may be inserted below the n-type clad layer.

After the second layer is grown, a first layer is stacked at the growth temperature of at most 830° C. The first layer is a nitride semiconductor mainly containing In and Ga. The growth temperature from the initiation of the growth of the lower guide layer and the initiation of the growth of the active layer should be at most 830° C., and further, the variation in the growth temperature should be at most 80° C. Thus, the distortion of the active layer caused by the nitride semiconductor layers mainly containing Al and Ga or the layers mainly containing Ga of the substrate and below the active layer can be alleviated. Specifically, In content of the second layer is approximately the same as the active layer, and the active layer stacked after the growth of the second layer may be grown under the condition with less distortion. While it is desirable that the second layer hardly absorbs laser light so that the increase of the internal loss is suppressed, an increase in the oscillation threshold value or in a current value in a low output in the range of practical use may be negligible even when the substantial bandgap of the second layer is small to the extent of absorbing the laser light, as long as the carrier lifetime of the second layer is approximately the same as the active layer or sufficiently longer, since the absorption characteristics are saturated in accordance with the laser oscillation of the semiconductor light emitting element. Thus, nitride semiconductor light emitting element thus manufactured provides, when operated at most at the threshold value, a unimodal emission spectrum, in which full width at half maximum is narrowed and the luminous efficiency is improved.

The first layer may or may not be added with an n-type impurity such as Si, and desirably the second layer and the active layer is distance from each other at least by 20 nm. The distance is from the top of the top well layer of the second layer to the bottom of the lowermost well layer of the active layer. Interruptions may be introduced during the growth of the first layer or the second layer by intervals of several nm to a few tens of nm. Thus, the morphology during the growth is improved, which enables an excellent growth of the active layer. It should be noted that the present invention is effective irrespective of the number of the well layers or the width of the well of the active layer.

Preferably, in the nitride semiconductor light emitting element of the present invention, the second layer functions as a saturable absorption layer, and the second layer is higher in In content than the first layer. Such a configuration enables to stabilize the characteristics of the active layer and the saturable absorption layer formed of the second layer (n-type saturable absorption layer), and to improve self-pulsation characteristics. In order to obtain an excellent self-pulsation, the saturable absorption layer and the active layer must be appropriate. Here, the term appropriate refers to a large differential gain and the optimum carrier lifetime, in which the saturable absorption layer is preferably 0.2 ns to 1.0 ns, approximately, and the active layer is preferably 1.0 ns to 3.0 ns, approximately. Although these characteristics are not largely different from semiconductor lasers of other materials such as GaAs, the growth method and the structure of the layers for obtaining such characteristics must be studied separately by nitride semiconductors. As above, in order to maintain the saturable absorption layer in an excellent state, the carrier lifetime must be shortened in addition to the requirement for the active layer.

If a p-type saturable absorption layer is to be inserted, it may be a layer mainly containing In and Ga, of which growth temperature is at least 650° C. and at most 850° C. Since the p-type saturable absorption layer is formed above the carried block layer, temperature drop occurs at least once after the growth of the active layer. According to the reasons above, in the nitride semiconductor laser provided with a p-type saturable absorption layer, it is very difficult to grow the active layer stably. In the present invention, excellent self-pulsation characteristics are obtained by studying in detail, in a nitride semiconductor laser provided with an n-type saturable absorption layer, the layer structure in the vicinity of the n-type saturable absorption layer and the layer structure above the n-type saturable absorption layer.

On a GaN substrate, an n-type clad layer mainly containing Al and Ga is formed, and an n-type guide layer mainly containing Ga is further stacked thereon by a few tens of nm (note that this n-type guide layer may be omitted). Thereafter, after lowering the growth temperature approximately to 730° C., an n-type saturable absorption layer mainly containing In and Ga is provided. The growth temperature of the n-type saturable absorption layer may be approximately 650° C. to 850° C.

As segregation of In of the n-type saturable absorption layer can be prevented by suppressing the variation in the growth temperature as small as possible in the process from the growth of the n-type saturable absorption layer to the growth of the active layer, the differential gain of the n-type saturable absorption layer can be maintained high. Accordingly, the change in the absorption coefficient corresponding to the carriers generated by the absorption can be made greater. Thus, nitride semiconductor laser readily attains the self-pulsation characteristics. Further, by growing the active layer after the growth of the layer mainly containing In and Ga, suppressing the variation in the temperature after the growth of the n-type saturable absorption layer as small as possible, the distortion of the active layer caused by the layers mainly containing Al and Ga, or the layers mainly containing Ga of the substrate and below the active layer can be alleviated. Specifically, if In content of the n-type saturable absorption layer is approximately the same as the active layer, the active layer can be grown under a condition with less distortion. By further providing a layer which hardly absorbs laser light having In content approximately the same as the active layer below the active layer, the segregation of In of the active layer is further alleviated, resulting in excellent self-pulsation characteristics. Such a layer may be provided above or below the n-type saturable absorption layer, and if it is provided below, the improvement in the characteristics of the n-type saturable absorption layer can also be expected.

The n-type saturable absorption layer desirably alleviates the carriers generated by the absorption quickly. According to the present invention, by providing a layer having poor crystallinity in the vicinity of the n-type saturable absorption layer, the carriers generated by the absorption can be alleviated from the layer with poor crystallinity by the tunnel effect. Specifically, in the layers below the n-type saturable absorption layer, there is a border that a variation in growth temperature is at least 100° C., above which the growth temperature is approximately the same as in the n-type saturable absorption layer. The layer grown at a temperature at least 100° C. higher than the n-type absorption layer indicates a layer mainly containing Al and Ga, and a layer mainly containing Ga. The appropriate carrier lifetime can be expected by setting the distance between the border and the n-type saturable absorption layer to 0 nm–20 nm, desirably 2 nm–10 nm. According to the nitride semiconductor layer of the present invention, among the holes and electrons generated in the n-type saturable absorption layer, the electrons of the minor carriers are considered to be alleviated from the layer or the border with poor crystallinity by the tunnel effect (non-radiation).

The carrier lifetime in the n-type saturable absorption layer is also expected to be shortened by interrupting the growth at the position of 0 nm–20 nm, desirably 2 nm–10 nm upper or lower from the n-type saturable absorption layer, and then by providing thermal hysteresis. For example, after the growth of the n-type saturable absorption layer, holding the growth temperature constant, a layer mainly containing In and Ga and having smaller In content than the n-type saturable absorption layer is formed by the amount as above. Thereafter, during the interruption of the growth, the substrate temperature is raised to approximately 900° C., and again lowered to approximately 730° C. Thereafter, the layer mainly containing In and Ga and having smaller In content than the n-type saturable absorption layer is grown. Since the interface with such a thermal hysteresis tends to invite In segregation and poor crystallinity, the carriers generated in the n-type saturable absorption layer become easier to be alleviated by the tunnel effect. It should be noted that such an effect can also be expected by the interruption of the growth only.

Further, below the active layer, a layer having approximately the same In content as the active layer and hardly absorbing laser light can be formed as a layer for facilitating the alleviation of the carriers. When employing the layer for such a use, the impurity concentration may be set to at least $1 \times 10^{20}$ cm$^{-3}$, or the growth temperature may be lowered. While the radiation transition probability rises by increasing the impurity concentration, by increasing it excessively high as described above, the increase in non-radiative transition probability is also expected. Also, by setting the impurity concentration at most $1 \times 10^{16}$ cm$^{-3}$, the increase of non-radiative transition probability is expected, and thus carriers tunneled from the n-type saturable absorption layer may be alleviated readily.

It is necessary to prevent the carriers injected from the upper and lower electrodes provided to the nitride semiconductor laser from entering the n-type saturable absorption layer, since it is difficult to grow a layer containing Al and Ga or a layer mainly containing Ga without In, due to the suppressed variation in the growth temperature from the n-type saturable absorption layer to the active layer as small as possible. Since the mobility of the holes in the n-type layer mainly containing In and Ga is small, the n-type saturable absorption layer and the active layer may be distanced at least by 20 nm. Here, the distance refers to the thickness from the top of the top well layer of the n-type saturable absorption layer to the bottom of the lowermost well layer of the active layer.

Further, in order to improve the characteristics of the active layer, a p-type layer mainly containing In and Ga may be provided between the active layer and the carrier block layer, desirably at the same growth temperature as the active layer. By providing p-InGaN layer, the optical confinement factor of the active layer may be increased. In the present invention, since the asymmetric guide layer structure in which a guide layer mainly containing In and Ga is provided at only n-side is employed, the center of optical distribution in vertical direction tends to move to the substrate side rather than to the active layer. Therefore, it is effective to provide a layer mainly containing In and Ga above the active layer and below the p-type carrier block layer. This newly inserted layer is desirably p-type, but the effect can be expected with a non-doped layer or an n-type layer.

The statement of the present specification "the variation in the growth temperature is suppressed as small as possible from the n-type saturable absorption layer to the active layer" do not contradict the above described temperature variation during the interruption of the growth, since the layers are not grown during the interruption. Further, the impurity concentration of the n-type saturable absorption layer is constant, and if the impurity concentration is raised, excellent self-pulsation characteristics can be obtained since the radiation transition probability increases.

First Embodiment

Figure 1B:
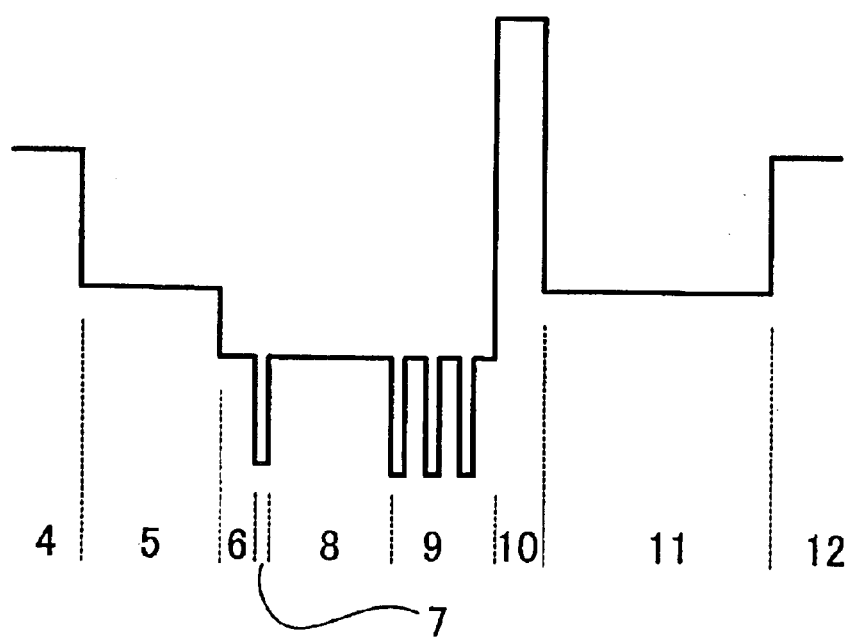

In a nitride semiconductor light emitting element, the luminous efficiency at the current injection can be improved by providing a lower guide layer between a lower clad layer and an active layer, in which the lower guide layer has a first and second layers. FIG. 1A is a cross sectional view of a semiconductor light emitting element manufactured according to the first embodiment seen from the direction of a resonator. The light emitting element includes: an n-type electrode 1, an n-GaN substrate 2, an n-GaN layer 3, an n-AlGaN clad layer 4, an n-GaN guide layer 5, an n-InGaN third layer 6, an n-InGaN second layer 7, an n-InGaN first layer 8, an n-InGaN active layer 9, a p-AlGaN carrier block layer 10, a p-GaN guide layer 11, a p-AlGaN clad layer 12, a p-GaN contact layer 13, an insulating layer 14 and a p-type electrode 15. n-InGaN active layer 9 is formed of a barrier layer and a well layer, having a structure of multiple quantum well (MQW) structure. FIG. 1B is a schematic diagram showing the energy level of each layer of the light emitting element manufactured according to the first embodiment. The In content of the third layer 6 and the first layer 8 is set to be equal.

The epitaxial growth method as used in the present specification is a method for growing a crystalline film on a substrate, and it includes VPE (Vapor Phase Epitaxial) method, CVD (Chemical Vapor Deposition) method, MOVPE (Metal Organic Vapor Phase Epitaxial) method, MOCVD (Metal Oxide Chemical Vapor Deposition) method, Halide-VPE (Halide Chemical Vapor Epitaxial) method, MBE (Molecular Beam Epitaxial) method, MOMBE (Metal Organic Molecular Beam Epitaxial) method, GSMBE (Gas Source Molecular Beam Epitaxial) method, and CBE (Chemical Beam Epitaxial) method.

Figure 3:
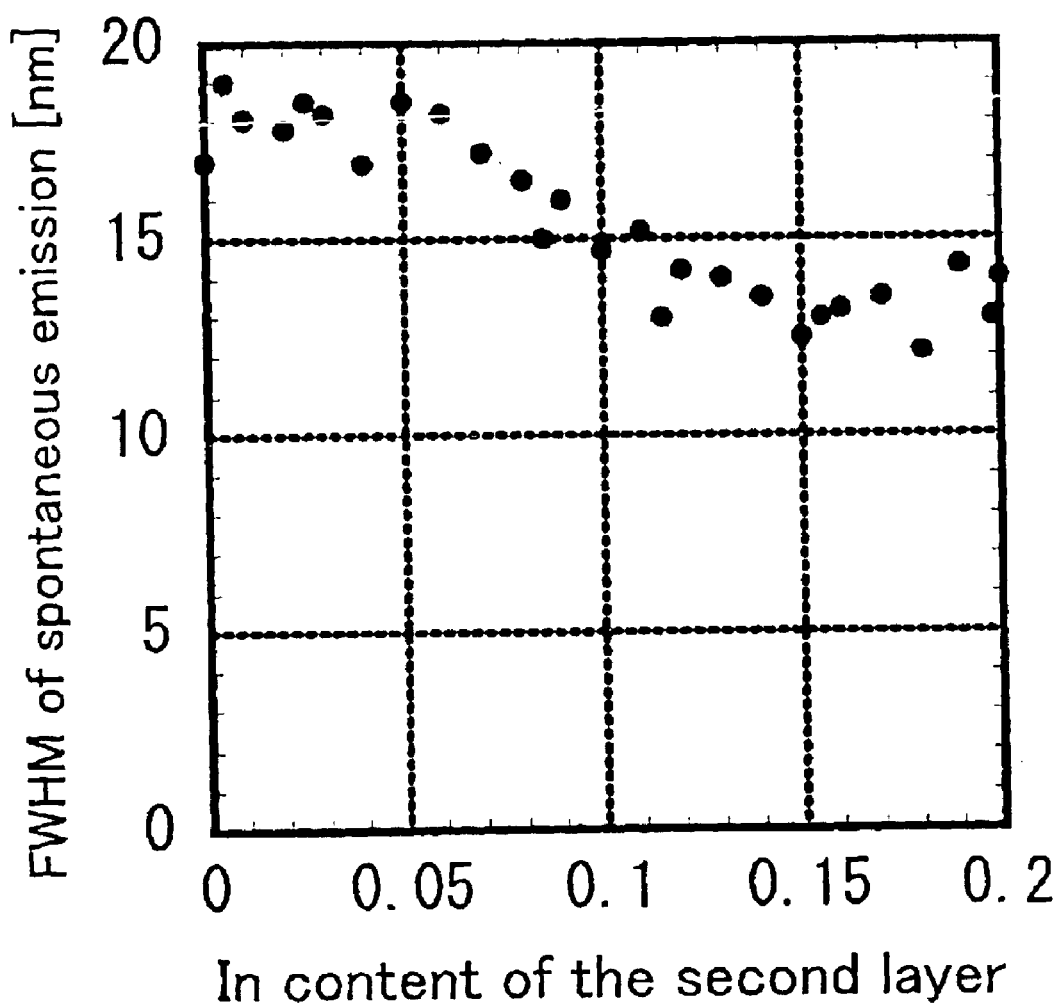
FIG. 3 shows changes in full width at half maximum of spontaneous emission when In content of a second layer according to a first embodiment of the present invention is changed.

The change in full width at half maximum of spontaneous emission was examined by SIMS by changing In content of the second layer, as shown in FIG. 3, when the active layer is a quantum well layer, it has been found that it is desirable if the In content $In_{(x)2}$ of the second layer is in the following range as compared to In content $In_{(x)0}$ of the well layer in the active layer, since full width at half maximum becomes narrower and the luminous efficiency improves:

$$In_{(x)2}-0.10 \leq In_{(x)0} \leq In_{(x)2}+0.10$$

A thickness $L_2$ of the second layer according to the first embodiment is the same as a thickness $L_0$ of the well layer in the active layer. By comparing the emission spectrum from the second layer with that from the active layer by PL photoluminescence) measurement, the narrowest full width at half maximum can be obtained when they are approximately the same. Accordingly, the condition effective to improve the active layer is $$Eg_0-0.35 \text{ eV} \leq Eg_2$$

where $Eg_0$ is substantial bandgap of the active layer and $Eg_2$ is the substantial bandgap of the second layer.

Further, since it is more desirable that the second layer hardly absorbs the laser light, $$Eg_0-0.05 \text{ eV} \leq Eg_2$$

is more desirable.

As for position of the second layer, the spontaneous emission (EL: electroluminescence) from the second layer at the current injection is observed, when $$L_1 < 20 \text{ nm}$$

where $L_1$ is the distance from the top of the second layer (p-type electrode side) to the bottom of the active layer (the bottom of the well layer at n-type electrode side). While the mobility of the holes in n-InGaN first layer 8 is small normally, the oscillation threshold value increases due to the hole being injected in the second layer 7 in the above described range. Therefore, $L_1$ is desirably $$L_1 \geq 20 \text{ nm.}$$

By increasing the distance between the second layer and the active layer, the full width at half maximum of spontaneous emission increases, and the crystallinity of the active layer degrades. Therefore, $$L_1 \leq 500 \text{ nm}$$

is desirable.

Figure 5:
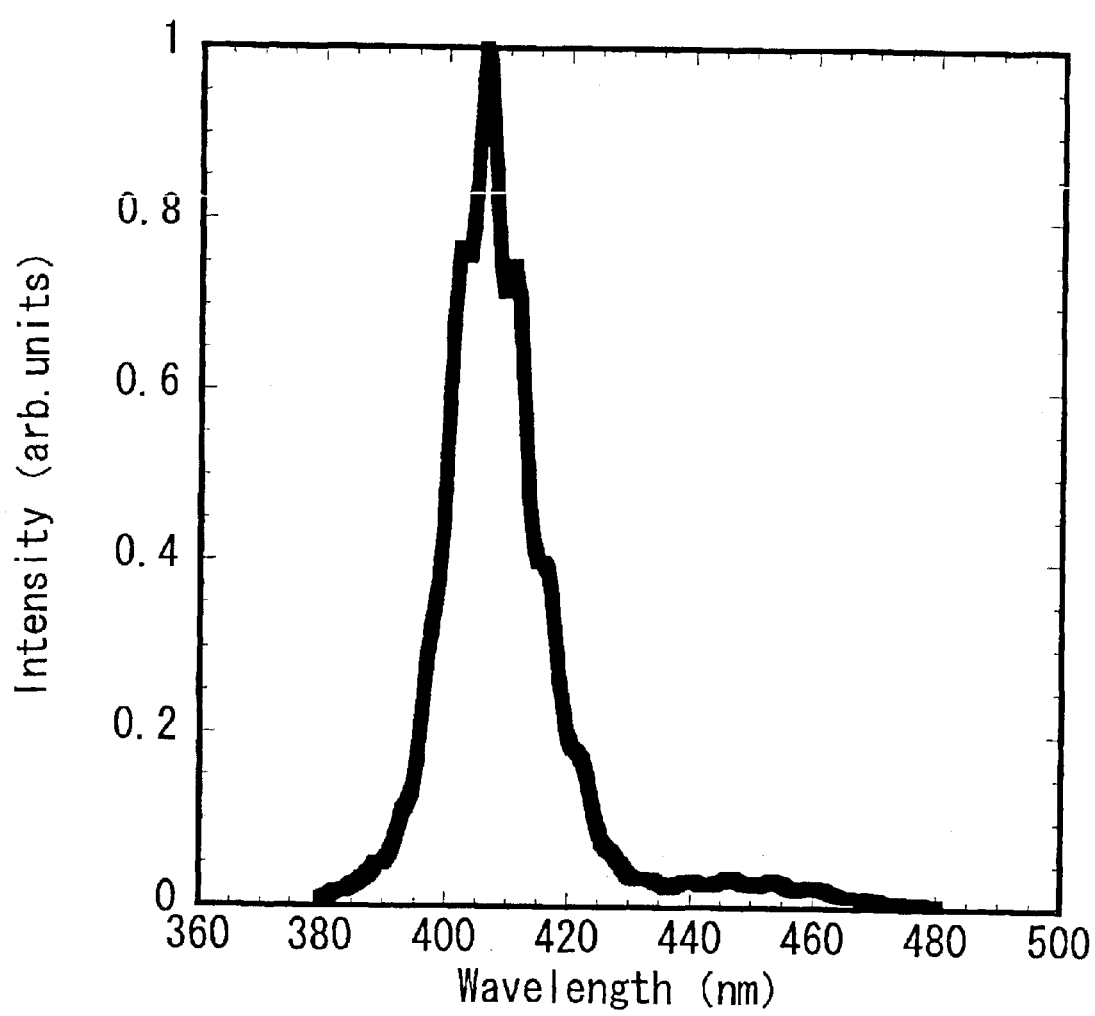
FIG. 5 shows spontaneous emission (spectrum) of a nitride semiconductor light emitting element where the growth temperature variation is more than 80° C. according to a conventional technique.

Now, the growth temperature of n-InGaN third layer 6 and n-InGaN first layer 8 is considered. Here, the growth temperature refers to the temperature of a wafer during the growth. By fixing the growth temperature of the second layer 7 and the active layer 9, and changing the growth temperature of n-InGaN third layer 6 and n-InGaN first layer 8, the full width at half maximum of spontaneous emission increases, light emitting component is observed at 440 nm and above as shown in FIG. 5, and the light emitting intensity decreases when $$\Delta T > 80° \text{ C.}$$

where $\Delta T$ is variation in the growth temperature from the initiation of the growth of the third layer to the end of the growth of the first layer, i.e., from the initiation of the growth of the lower guide layer until the initiation of the growth of the active layer. This component is considered to be a band tail of the active layer or the effect of the fluctuation in In content. Therefore, it is necessary to be $$\Delta T \leq 80° \text{ C.}$$

It is noted that the width at half maximum of spontaneous emission increases even in the range of the temperature variation as above if the growth temperature of the second layer 7 and the active layer 9 is raised. Therefore, from the initiation of the growth of the n-InGaN lower guide layer until the initiation of the growth of the active layer, all of the growth temperature T of each layer must be $$T \leq 830° \text{ C.}$$

By considering the thickness $L_2$ of the second layer 7, it is found that the effect of the present invention can be expected if it satisfies the condition above. Desirably, the specific thickness $L_2$ of the second layer is 0.5 nm–20 nm, when the second layer is a single quantum well. When the thickness of the second layer is less than 0.5 nm, the above effect can hardly be expected since layered structure is difficult to be obtained because of the atomic radius of In being greater than that of Ga and N. On the other hand, when the thickness is greater than 20 nm, if In content is approximately the same as the active layer, the internal loss $\alpha_i[\text{cm}^{-1}]$ increases significantly, due to the substantial bandgap becoming smaller. Thus, In content is reduced in order to suppress the increase of the internal loss $\alpha_i[\text{cm}^{-1}]$, diminishing the effect of the present invention.

Now, third layer 6 is considered. When third layer 6 is omitted, the internal loss $\alpha_i[\text{cm}^{-1}]$ of the nitride semiconductor light emitting element increases. It is assumed that the absorption occurs at the interface of n-GaN guide layer 5 and second layer 7. It is assumed that this absorption is caused by a region with poor crystallinity at the interface, which is formed because of large lattice mismatch of the second layer with large In content and n-GaN guide layer 5 being positioned adjacent to each other. Therefore, desirably a third layer 6 smaller in In content than second layer 7 is provided. The maximum thickness of third layer $L_3$ is a parameter that should be defined by the confinement factor of the active layer or by the vertical transverse mode, and therefore it is not defined by the effect of the present invention. Here, the lower guide layer is a layer positioned between n-GaN guide layer 5 (when n-GaN guide layer is not present, n-AlGaN clad layer 4) and active layer 9, and it is a nitride layer mainly containing In and Ga, and including third layer 6, second layer 7 and first layer 8. When third layer 6 is omitted, second layer 7 and first layer 8 are included.

The effect of the present specification can be expected, even when the layer structure between the n-guide layer and the substrate, such as n-AlGaN clad layer 4, changes. Additionally, while the improvement in the full width at half maximum of spontaneous emission and luminous efficiency can be expected by n-InGaN second layer 7 even when In is omitted from n-InGaN third layer 6 and n-InGaN first layer 8, the effect thereof is smaller than the light emitting element of the present invention. While GaN substrate is employed in the first embodiment, the effect of the present invention can be expected also with a substrate of sapphire, SiC, GaAs, SI, $ZrB_2$ and the like. Normally, when such a substrate is employed, a buffer layer is provided on the substrate on which an n-type nitride layer containing Al and Ga is provided.

Now, a case where the second layer functions as a saturable absorption layer is considered. By changing In content of the second layer and observing change in the full width at half maximum of spontaneous emission, it is found that the condition effective for improving the characteristics of the active layer may be $$Eg_2-0.35 \text{ eV} \leq Eg_0 \leq Eg_2+0.35 \text{ eV}.$$

Further, by measuring the full width at half maximum of spontaneous emission and In content of the second layer using SIMS to compare, it is found that $$In_{(x)2}-0.10 \leq In_{(x)0} \leq In_{(x)2}+0.10$$

is effective for improving the characteristics of the active layer.

However, in order to maintain excellent self-pulsation characteristics, $$Eg_2-0.02 \text{ eV} \leq Eg_0 \leq Eg_2+0.15 \text{ eV}$$

is desirable, and laser light can be absorbed appropriately. For maintaining excellent self-pulsation characteristics, $$In_{(x)1} < In_{(x)2}$$

$$In_{(x)3} < In_{(x)2}$$

is preferable, where $In_{(x)1}$ is In content of first layer 8, and $In_{(x)3}$ is In content of third layer 6.

Further, for carrier confinement in the active layer, $$Eg_1 > Eg_0$$

is desirable, where $Eg_1$ is the substantial bandgap of first layer 8, and $Eg_0$ is the substantial bandgap of the active layer.

Still further, excellent self-pulsation characteristics can be expected when thickness $L_2$ of second layer in the first embodiment is $$0.5 \text{ nm} \leq L_2 \leq 5 \text{ nm}.$$

If the thickness of the second layer is more than 5 nm, it is considered that the quantum effect is diminished and differential gain is decreased, since overlapping of the spatial distributions of electrons and holes reduces. If the thickness is less than 0.5 nm, it is considered that differential gain is decreased, since the evenness may not be achieved when forming InGaN layer because of In being greater in the atomic radius than Ga and N.

If the distance between the second layer and the active layer is widened, the effect of time-varying modulation of photon density is diminished and self-pulsation can hardly be attained, since the optical confinement factor of the second layer becomes smaller. Therefore, $$L_1 < 200 \text{ nm}$$

is desirable.

Figure 6:
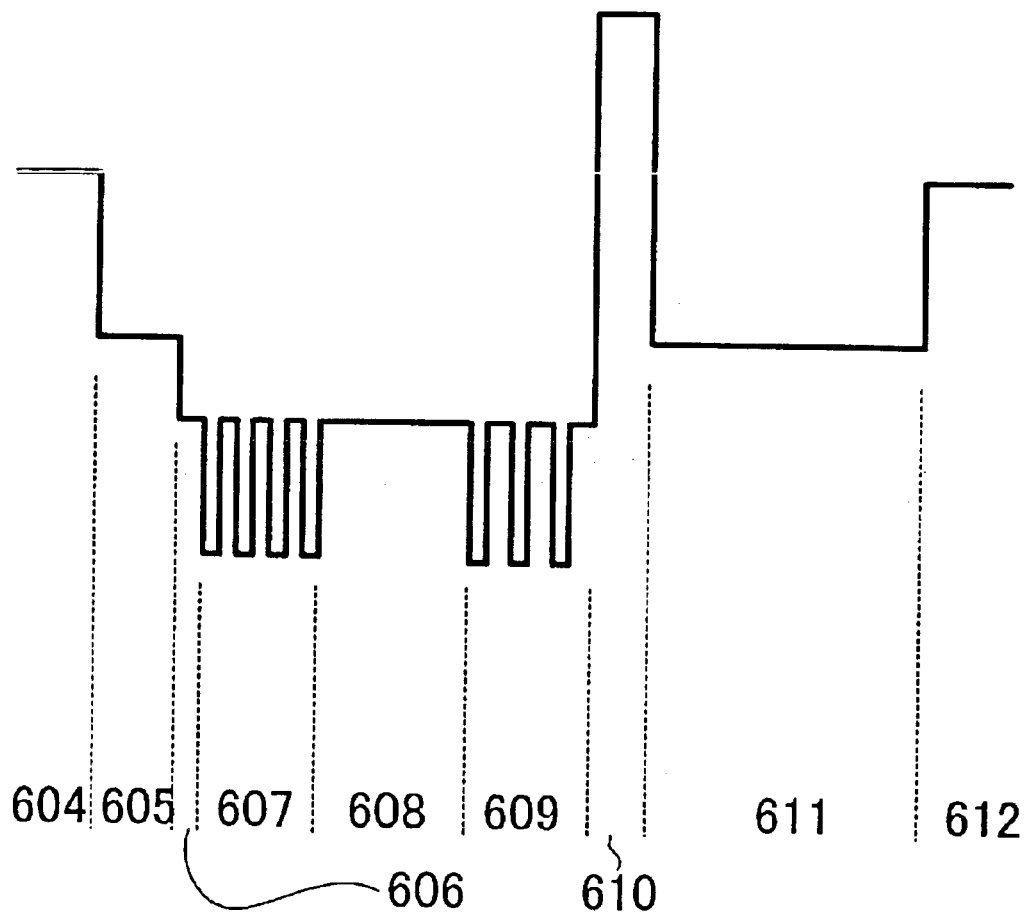
FIG. 6 is a schematic diagram showing the energy levels of each layer according to a second embodiment of the present invention.

The effect of the present invention can also be expected when the different impurities are contained in n-InGaN third layer 6, n-InGaN second layer 7, and n-InGaN first layer 8, as long as they have n-type characteristics. Next, when second layer 7 has a multiple quantum well structure, the nitride semiconductor laser thus manufactured is expected to have, when operated at most at threshold value, unimodal spontaneous emission spectrum, attaining RIN<−125 dB/Hz at light output of 5 mW. Additionally, stable self-pulsation characteristics may be obtained. FIG. 6 shows the energy level in this structure.

Referring to FIG. 6, excellent self-pulsation characteristics can be obtained, when $$Eg_2'-0.02 \text{ eV} < Eg_0 < Eg_2'+0.15 \text{ eV}$$

and $$In_{(x)2}'-0.10 < In_{(x)0} < In_{(x)2}'+0.10$$

where $Eg_2'$ is the substantial bandgap of second layer 607 formed of a multiple quantum well, and $In_{(x)2}'$ is In content of the well layer, and $$Eg_1 > Eg_2'$$

$$Eg_3 > Eg_2'$$

where $Eg_1$ is the bandgap of first layer 608, and $Eg_3$ is the bandgap of third layer 606.

For obtaining excellent self-pulsation characteristics, desirably the distance $L_1'$ from top of the n-type saturable absorption layer (p-electrode side) to the bottom of the active layer (the edge of the well layer at n-electrode side) may be $$L_1' > 20 \text{ nm}$$

while thicknesses $L_2'$ of respective well layers is desirably $$0.5 \text{ nm} \leq L_2' \leq 5.0 \text{ nm}.$$

The nitride semiconductor light emitting element according to the present invention has a ridge structure. In this structure, a refractive index waveguide structure is formed by narrowing the electric current in the ridge portion and the built-in refractive index difference. However, the effect of the present invention is not limited to the ridge structure, and it may be a gain waveguide structure with a stripe electrode, an embedded structure in which an insulating layer of the ridge structure is formed of a layer mainly containing Al and Ga, or Ga, or a block structure, and a known optical confinement technique of a semiconductor light emitting element can be employed. It should be noted that the thickness of each layer must be adjusted slightly so that the optical confinement factor of the second layer does not change. Here, the layers of which thicknesses are specifically defined in the first embodiment, i.e., first layer 8, second layer 7 and third layer 6 should be formed in the range mentioned above.

Figure 16:
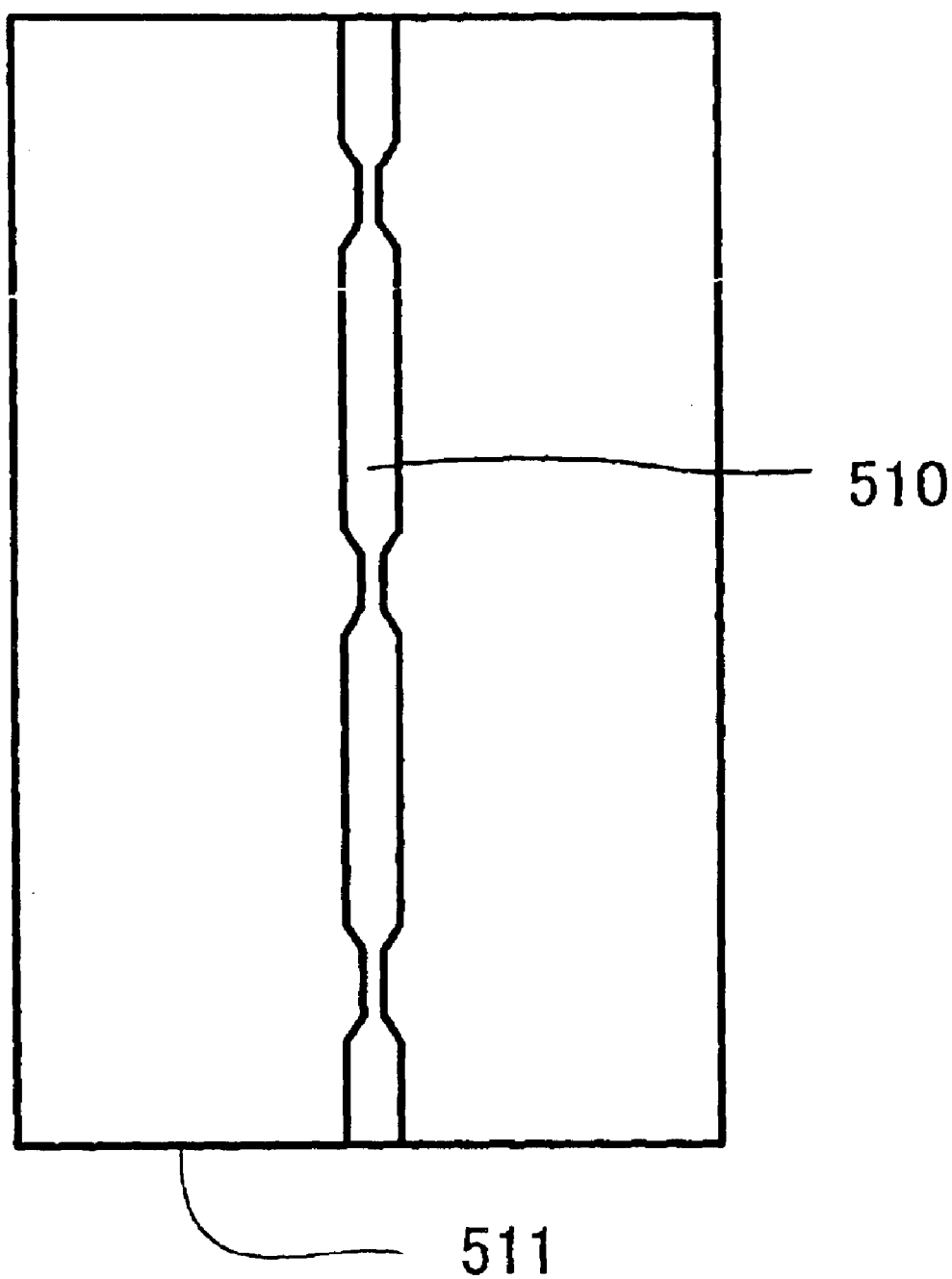
FIGS. 16 and 17 show one example of a semiconductor light emitting element according to the first embodiment of the present invention.

The distribution of laser light in the horizontal direction relative to the layer structure depends on the ridge width, which affects the saturable absorption characteristics of the second layer. However, the optimum condition can be attained as long as it remains in the range of $L_2$ as described above. The effect of the present invention can be attained with the ridge width of 0.5 μm–8.0 μm, approximately (including the width of the portion narrowing the electric current and the like). FIG. 16 shows semiconductor laser 511 seen from the top face of p-electrode. As shown in the figure, it may have a modulation stripe structure, where at least two types of width of ridge 510 are present in the longitudinal direction. In such a way, providing the modulated stripe structure in the semiconductor laser having the saturable absorption layer, there exist a region A with wider ridge width and a region B with narrower ridge width. Here, $$S_A > S_B$$

where $S_A$ is photon density in the saturable absorption layer below region A, and $S_B$ is photon density in the saturable absorption layer below region B. Thus, the saturable absorption of the saturable absorption layer below the region A is facilitated. On the other hand, it is difficult for the saturable absorption layer below region B to attain saturable absorption up to high output, and thus a semiconductor laser that can provide self-pulsation from low output to high output can be obtained.

Figure 17:
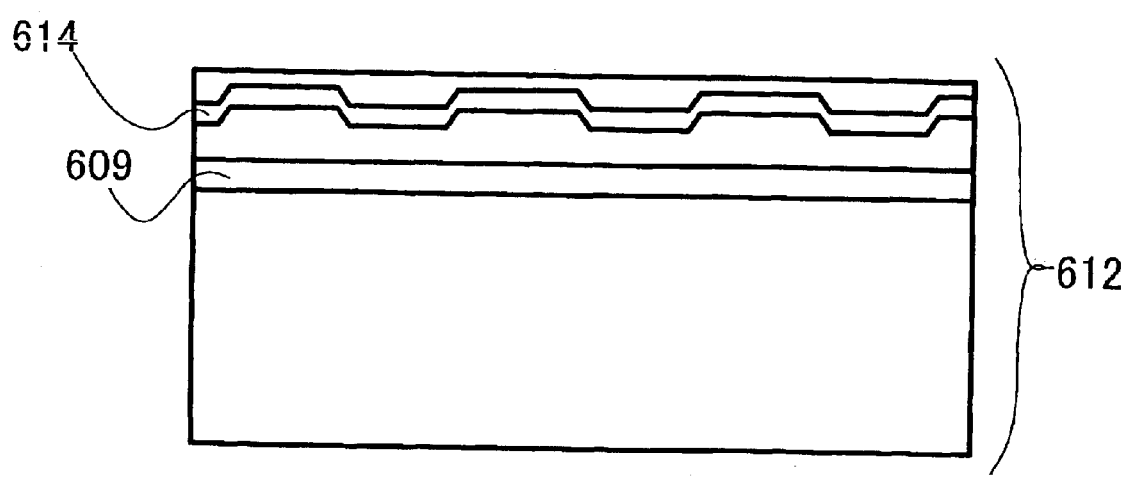

FIG. 17 shows semiconductor laser 612 seen from lateral direction. As shown in the figure, it may be a semiconductor laser having at least two types of thickness of the ridge side in a longitudinal direction. The thickness of the ridge side refers to the distance from the top of active layer 609 to insulating layer 614 in a ridge side region. In the semiconductor laser thus produced, there exist a region C with smaller thickness of the ridge side, and a region D with greater thickness of the ridge side, and $$S_C > C_D,$$

where $S_C$ is the photon density in the saturable absorption layer below region C, and $S_D$ is the photon density in the saturable absorption layer below region D. Thus, the saturable absorption of the saturable absorption layer below region C is facilitated.

On the other hand, it is difficult for the saturable absorption layer below region D to attain saturable absorption up to high output, and thus a semiconductor laser that can provide self-pulsation from low output to high output can be obtained. The laser structures shown in FIGS. 16 and 17 are characterized in having regions in which light distribution is different in stripe longitudinal direction, and in which photon density of saturable absorption layer is different between the respective regions. All of the structures having this characteristics can be utilized as an excellent self-pulsation laser. The effect of the first embodiment can be attained when the number of well layers in a multiple quantum well active layer is one to ten, each of the well width being 1 to 10 nm. This applies as well to seventh to eleventh embodiments that will be described later.

Second Embodiment

It is desirable to form the second layer in the first embodiment to have a multiple quantum well structure, since the nitride semiconductor light emitting element provides, when operated at most at a threshold value, unimodal spectrum of spontaneous emission with narrow full width at half maximum, improving luminous efficiency. FIG. 6 is a schematic diagram showing the energy level of each layer in the present structure. On the substrate of this light emitting element, an n-AlGaN clad layer 604, an n-GaN guide layer 605, an n-InGaN third layer 606, n-InGaN second layer 607, an n-InGaN first layer 608, an n-InGaN active layer 609, a p-AlGaN carrier block layer 610, a p-GaN guide layer 611, a p-AlGaN clad layer 612 are formed.

As the effect of the present invention can be expected, $$In_{(x)2}' - 0.10 \leq In_{(x)0} \leq In_{(x)2}' + 0.10$$

is desirable, where $In_{(x)2}'$ is In content of the well layer in second layer 607 formed of a multiple quantum well, and $In_{(x)0}$ is In content of the well layer in active layer 609. Further, $$Eg_0 - 0.35 \text{ eV} \leq Eg_2'$$

is desirable, where $Eg_2'$ is the substantial bandgap of second layer 607, and $Eg_0$ is the substantial bandgap of active layer 609. Still further, since it is desirable that the second layer hardly absorbs laser light, $$Eg_0 - 0.05 \text{ eV} \leq Eg_2'$$

is further desirable.

$$Eg_1 > Eg_2'$$

$$Eg_3 > Eg_2'$$

is desirable, where $Eg_1$ is the bandgap of first layer 608, and $Eg_3$ is the bandgap of third layer 606.

$$20 \text{ nm} \leq L_1' \leq 500 \text{ nm}$$

is desirable, where is $L_1'$ is the distance from the top of second layer 607 (p-type electrode side) formed of a multiple quantum well to the bottom the active layer (the edge of the well layer at n-type electrode side).

Thickness $L_2'$ of one well layer in the second layer formed of a multiple quantum well is examined, and found that $$0.5 \text{ nm} \leq L_2' \leq 20 \text{ nm}$$

is desirable. It is based on the difficulty in forming layered structure because of In being greater in the atomic radius than Ga and N, as described above.

Third Embodiment

Figure 7A:
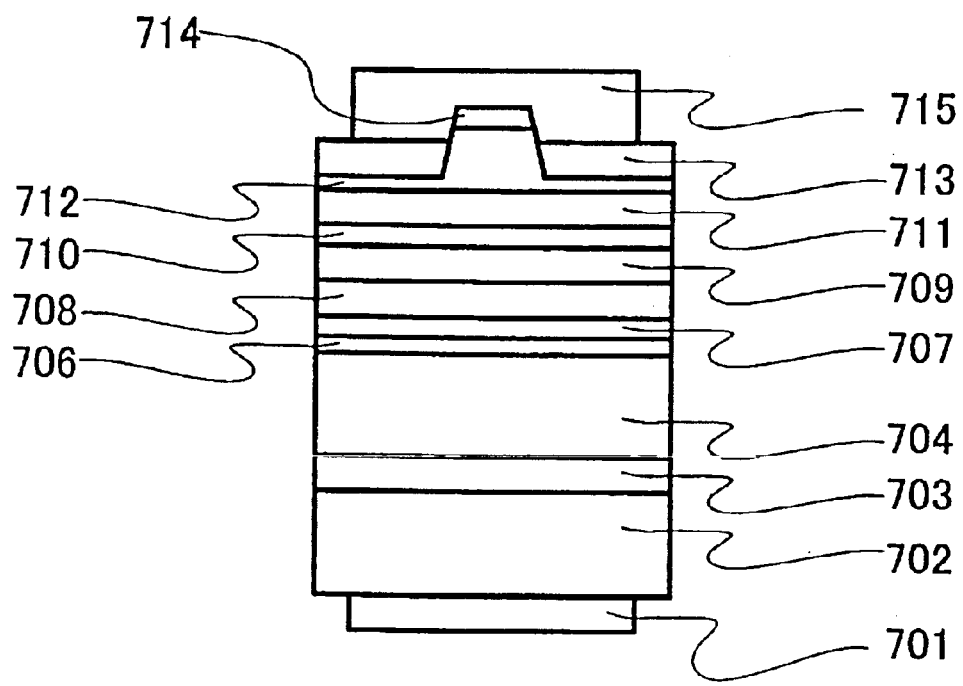
Figure 7B:
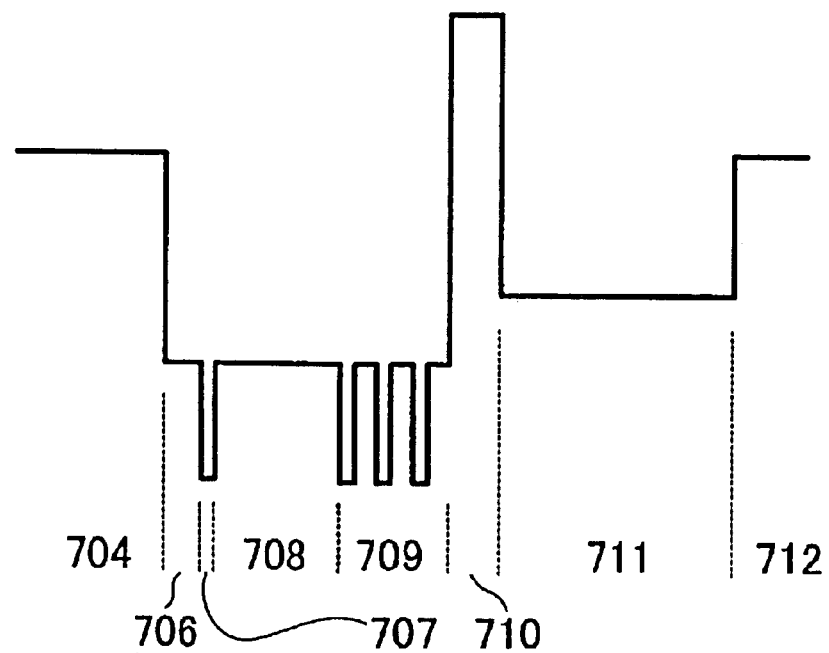

In the third embodiment, a structure where the n-GaN guide layer of the first embodiment is omitted is considered. FIG. 7A is a cross sectional view of a semiconductor light emitting element seen from the direction of a resonator. FIG. 7B is a schematic diagram showing the energy level of each layer in this structure. This light emitting element includes: an n-type electrode 701, an n-GaN substrate 702, an n-GaN layer 703, an n-AlGaN clad layer 704, an n-InGaN third layer 706, an n-InGaN second layer 707, an n-InGaN first layer 708, an n-InGaN active layer 709, a p-AlGaN carrier block layer 710, a p-GaN guide layer 711, a p-AlGaN clad layer 712, a p-GaN contact layer 713, an insulating layer 714 and a p-type electrode 715.

When the thickness of the n-GaN guide layer according to the first embodiment is changed, the optical confinement factor of the active layer changes. Since the third layer, the second layer and the first layer also function as the light guide layers at n-side, the propagation light will be confined around the active layer even when the n-GaN guide layer is not present. In special, when the thickness of the first to the third layers is large, it is desirable not to provide the n-GaN guide layer, since the confinement factor of the active layer can be made higher.

The nitride semiconductor light emitting element thus manufactured provides a unimodal spectrum of spontaneous emission when operated at most at a threshold value, improving the luminous efficiency. Further, when the second layer is provided to function as a saturable absorption layer and when In content of n-InGaN third layer 706 and n-InGaN first layer 708 is large, the n-GaN guide layer may be made thinner or may be omitted, since the light distribution vertical relative to the layer structure tends to move toward the substrate side. With such a nitride semiconductor light emitting element, RIN<−125 dB/Hz can be expected at the light output of 5 mW. The self-pulsation characteristics can stably be obtained As above, the n-GaN guide layer may be omitted for obtaining excellent noise characteristics that is the object of the present invention.

Fourth Embodiment

Figure 8A:
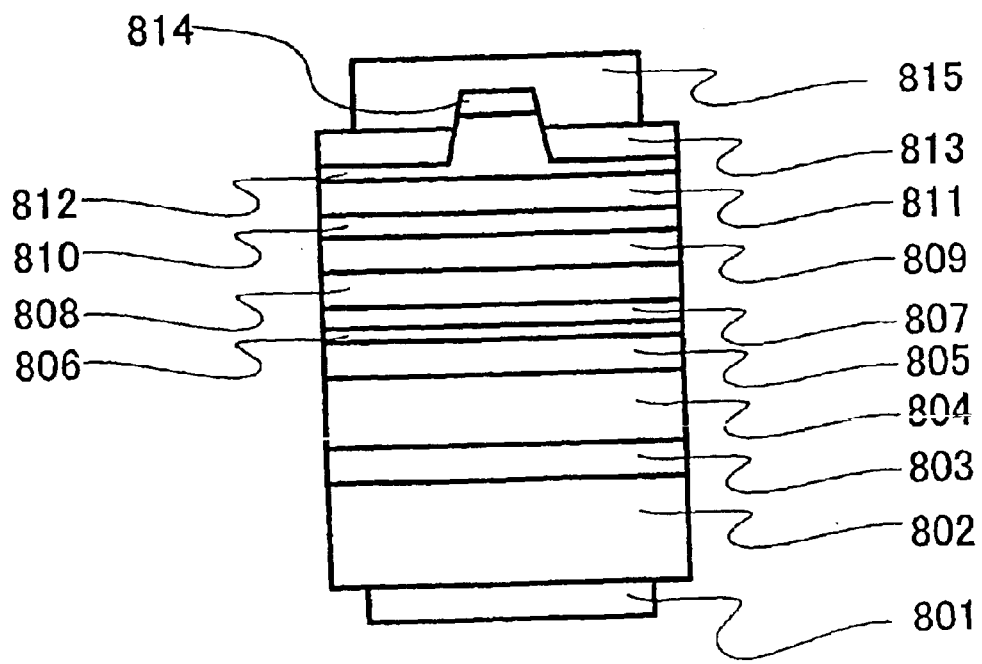
Figure 8B:
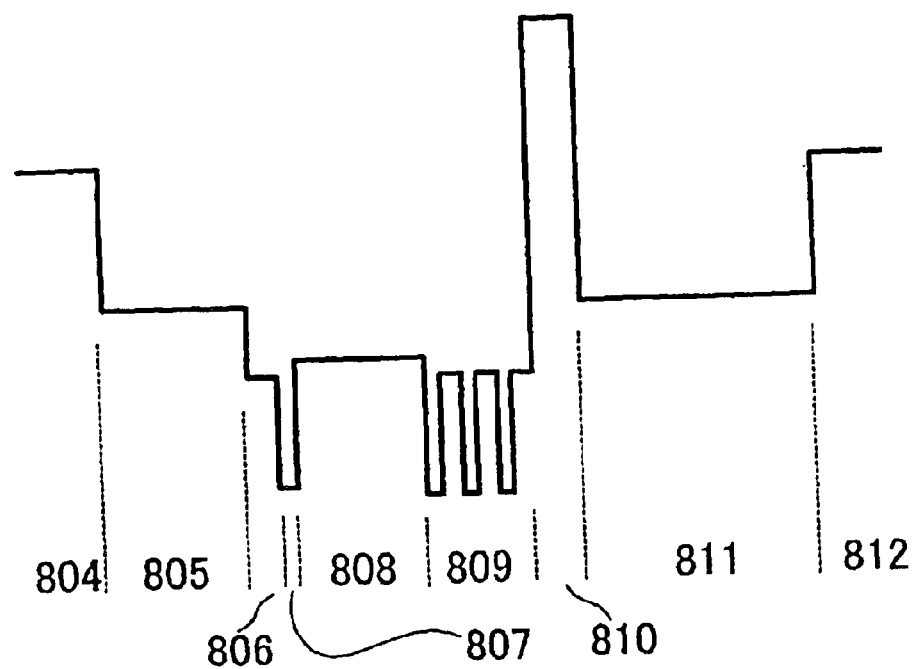

In the fourth embodiment, a structure where In content of the n-InGaN first layer according to the first embodiment is changed is considered. FIG. 8A is a cross sectional view of a semiconductor light emitting element in which In content of the n-InGaN first layer is reduced, seen from the direction of a resonator. FIG. 8B is a schematic diagram showing the energy level of each layer in this structure. This light emitting element includes: an n-type electrode 801, an n-GaN substrate 802, an n-GaN layer 803, an n-AlGaN clad layer 804, an n-GaN guide layer 805, an n-InGaN third layer 806, and n-InGaN second layer 807, an n-InGaN first layer 808, an n-InGaN active layer 809, a p-AlGaN carrier block layer 810, a p-GaN guide layer 811, a p-AlGaN clad layer 812, a p-GaN contact layer 813, an insulating layer 814, and a p-type electrode 815.

Figure 9A:
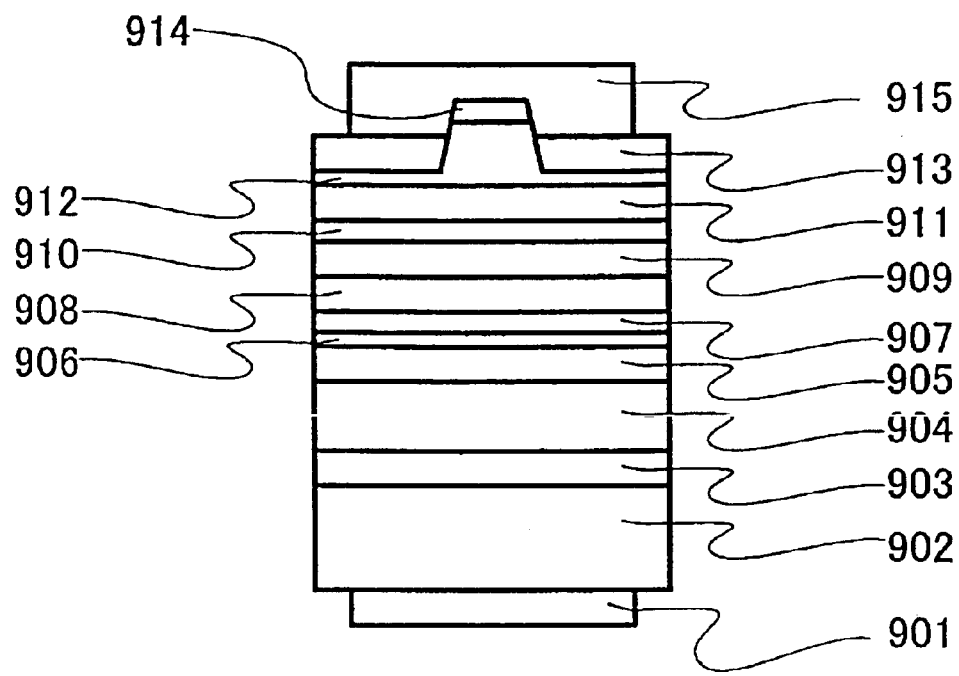
Figure 9B:
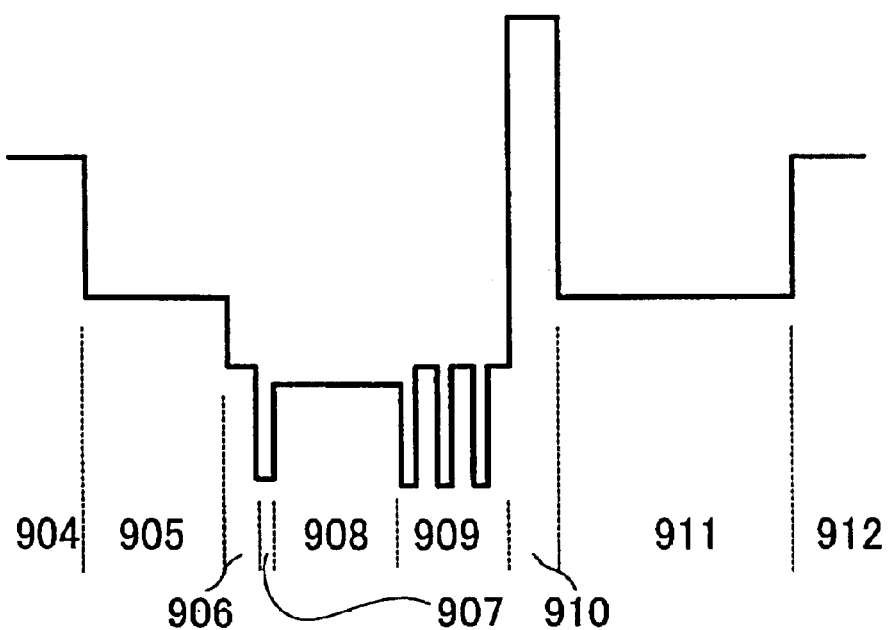

FIG. 9A is a cross sectional view of a semiconductor light emitting element in which In content of the n-InGaN first layer is increased, seen from the direction of a resonator. FIG. 9B is a schematic diagram showing the energy level of each layer in this structure. This light emitting element includes: an n-type electrode 901, an n-GaN substrate 902, an n-GaN layer 903, an n-AlGaN clad layer 904, an n-GaN guide layer 905, an n-InGaN third layer 906, an n-InGaN second layer 907, an n-InGaN first layer 908, an n-InGaN active layer 909, a p-AlGaN carrier block layer 910, a p-GaN guide layer 911, a p-AlGaN clad layer 912, a p-GaN contact layer 913, an insulating layer 914, and a p-type electrode 915.

Figure 10A:
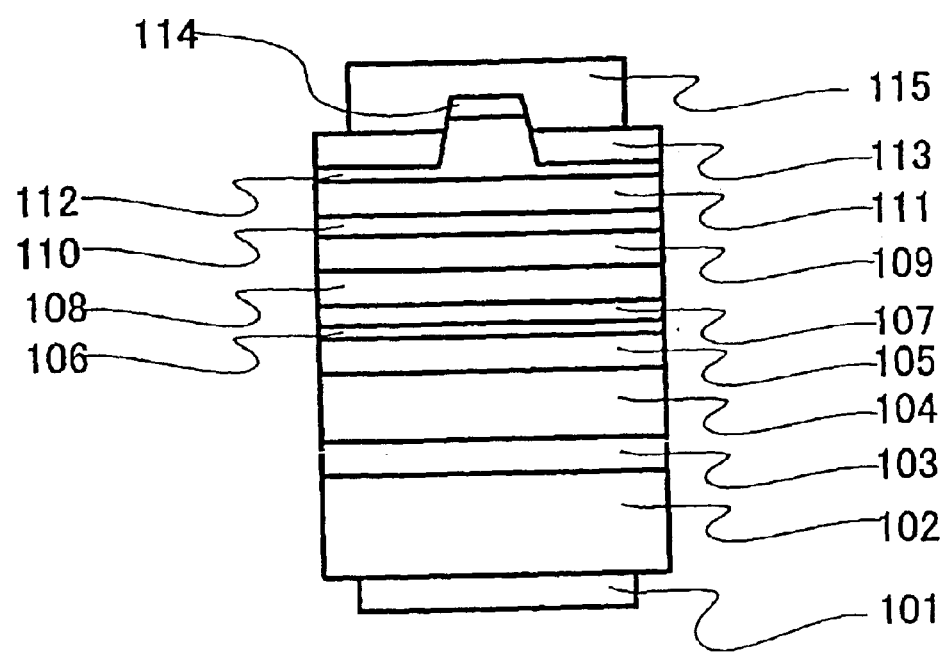
Figure 10B:
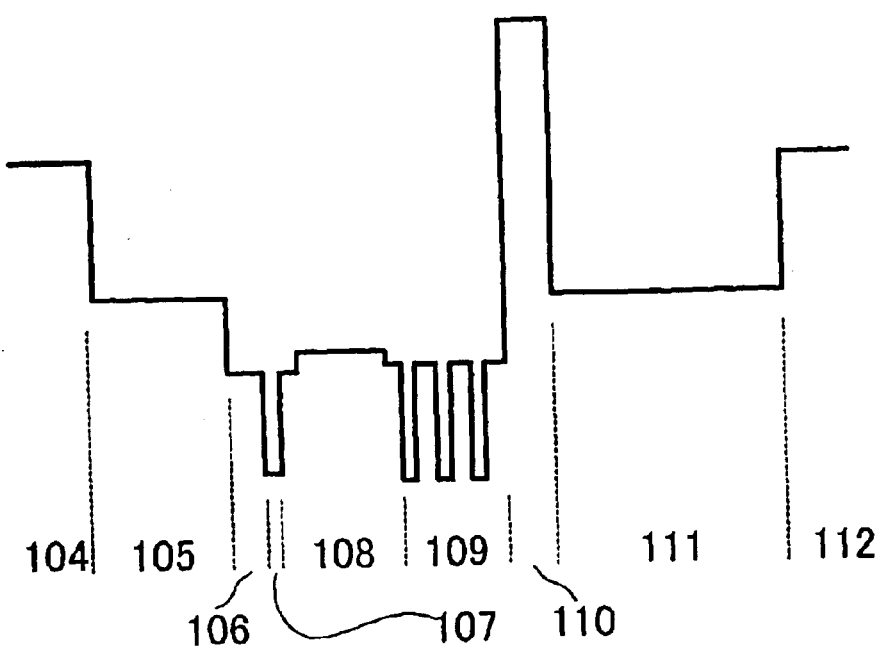

FIG. 10A is a cross sectional view of a semiconductor light emitting element in which In content of the n-InGaN first layer is not uniform, and having at least two regions of different In content, seen from the direction of a resonator. FIG. 10B is a schematic diagram showing the energy level of each layer in this structure. This light emitting element includes: an n-type electrode 101, an n-GaN substrate 102, an n-GaN layer 103, an n-AlGaN clad layer 104, an n-GaN guide layer 105, an n-InGaN third layer 106, an n-InGaN second layer 107, an n-InGaN first layer 108, an n-InGaN active layer 109, a p-AlGaN carrier block layer 110, a p-GaN guide layer 111, a p-AlGaN clad layer 112, a p-GaN contact layer 113, an insulating layer 114, and a p-type electrode 115.

Figure 11A:
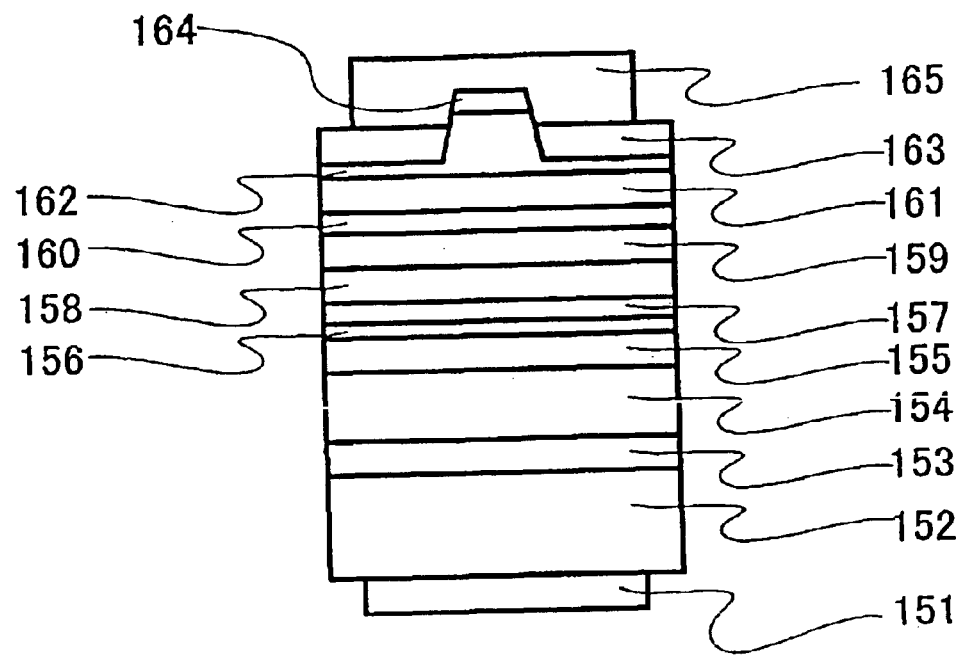
Figure 11B:
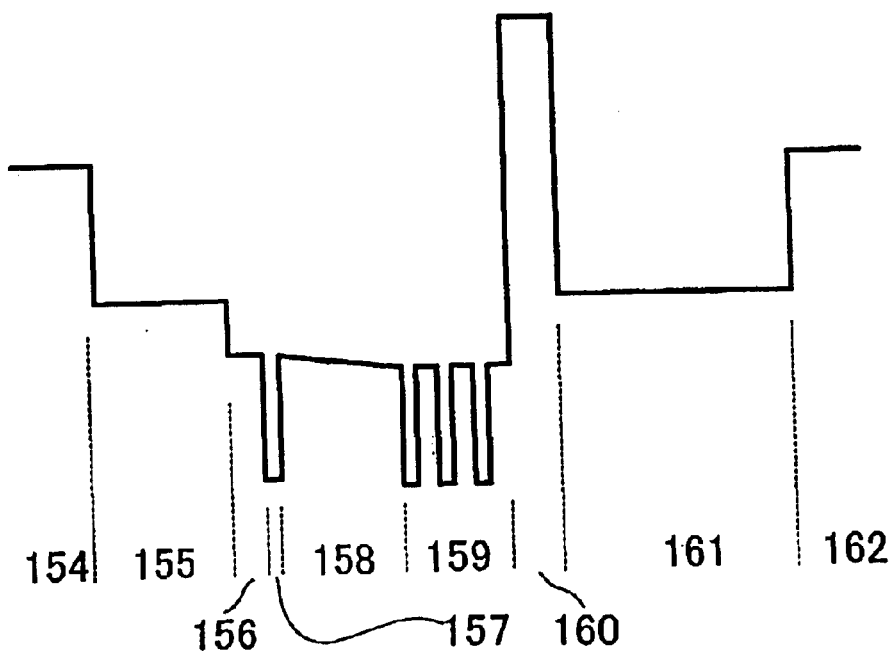

FIG. 11A is a cross sectional view of a semiconductor light emitting element in which In content of the n-InGaN first layer is successively changes, seen from the direction of a resonator. FIG. 11B is a schematic diagram showing the energy level of each layer in this structure. This light emitting element includes: an n-type electrode 151, an n-GaN substrate 152, an n-GaN layer 153, an n-AlGaN clad layer 154, an n-GaN guide layer 155, an n-InGaN third layer 156, an n-InGaN second layer 157, an n-InGaN first layer 158, an n-InGaN active layer 159, a p-AlGaN carrier block layer 160, a p-GaN guide layer 161, a p-AlGaN clad layer 162, a p-GaN contact layer 163, an insulating layer 164, and a p-type electrode 165.

In order to obtain the carrier confinement effect in the active layer, $$Eg_0 < Eg_1$$

is desirable, where $Eg_1$ is the substantial bandgap of the first layer and $Eg_0$ is the substantial bandgap of the active layer. Further, $$In_{(x)1} - 0.02 \leq In_{(x)0}' \leq In_{(x)1} + 0.02$$

$$0 \leq In_{(x)1}$$

is desirable, where $In_{(x)1}$ is In content of the first layer and $In_{(x)0}'$ is In content of the barrier layer in the active layer.

The nitride semiconductor light emitting element thus manufactured provides unimodal spectrum of spontaneous emission when operated at most at threshold value, improving the luminous efficiency. Further, RIN<−125 dB/Hz can be expected at light output of 5 mW. A small amount of In is mixed into the n-InGaN first layer, in order to suppress the variation in the growth temperature as small as possible during the growth process of the second to the active layers. Therefore, it is desirable that the first layer is smaller in In content than the well layer in the active layer for improving the carrier confinement effect to the active layer and lowering the threshold value, though it is not intended to limit the In content to a narrow range.

Fifth Embodiment

Figure 12A:
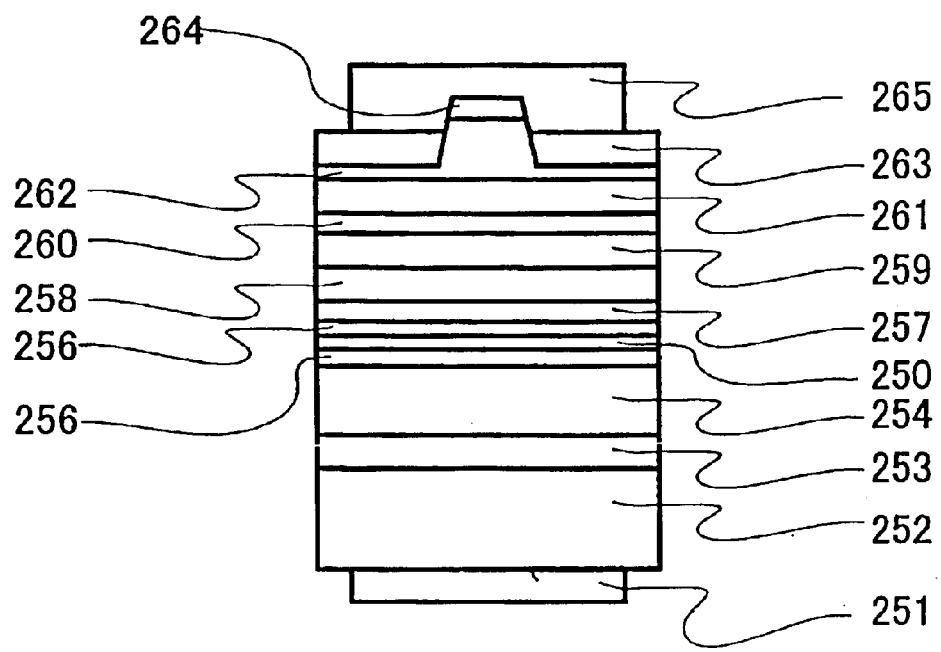
Figure 12B:
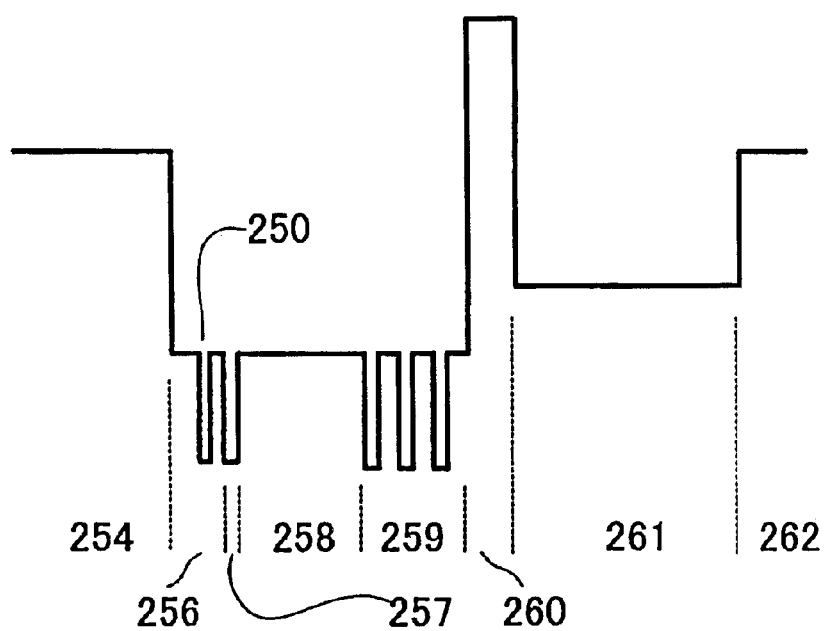

In the fifth embodiment, a structure where the third layer according to the first embodiment has a fourth layer higher in In content than the third layer is considered. FIG. 12A is a cross sectional view of a semiconductor light emitting element seen from the direction of a resonator. FIG. 12B is a schematic diagram showing the energy level of each layer in this structure. This light emitting element includes: an n-type electrode 251, an n-GaN substrate 252, an n-GaN layer 253, an n-AlGaN clad layer 254, an n-GaN guide layer 255, an n-InGaN third layer 256, an n-InGaN fourth layer 250, an n-InGaN second layer 257, an n-InGaN first layer 258, an n-InGaN active layer 259, a p-AlGaN carrier block layer 260, a p-GaN guide layer 261, a p-AlGaN clad layer 262, a p-GaN contact layer 263, an insulating layer 264, and a p-type electrode 265.

In the first embodiment, the second layer also serves to alleviate the distortion of the active layer affected by the substrate, the n-AlGaN clad layer and the n-GaN guide layer, and fourth layer 250 according to the fifth embodiment is for supporting such an effect. Additionally, since the distortion affecting the second layer 257 is also alleviated by providing fourth layer 250, second layer 257 that functions as saturable absorption layer attains large differential gain and excellent self-pulsation characteristics. The substantial bandgap of fourth layer 250 is greater than the substantial bandgap of the active layer, and the absorption coefficient to laser light is very small.

Specifically, $$In_{(x)3} < In_{(x)4}$$

and $$In_{(x)4} - 0.10 \leq In_{(x)0} \leq In_{(x)4} + 0.10$$

is desirable, where $Eg_4$ is the substantial bandgap of fourth layer 250 and $In_{(x)4}$ is In content of the fourth layer.

Further, the condition effective in improving the characteristics of the active layer is $$Eg_0 - 0.35 \text{ eV} \leq Eg_4$$

and further, since it is desirable that the second layer hardly absorbs laser light, $$Eg_0 - 0.05 \text{ eV} \leq Eg_4$$

is further desirable.

The nitride semiconductor light emitting element thus manufactured facilitates to narrow the full width at half maximum of spontaneous emission that is absorbed in the operation at most at the threshold value as compared to the first embodiment, and a stable self-pulsation characteristics are expected to be attained. Though fourth layer 250 is formed of a single quantum well according to the fifth embodiment, it may be a multiple quantum well structure, or may be formed of a plurality of layers of different substantial bandgaps. In those cases, each of the layers may only satisfy the condition of $Eg_4$ and $In_{(x)4}$ as stated above.

Since fourth layer 250 is positioned in the vicinity of second layer 257 that functions as a saturable absorption layer, it is expected that it absorbs laser light so that carriers generated in second layer 257 tunnel to fourth layer 250. When the carrier lifetime of fourth layer 250 is short, the self-pulsation is facilitated since the carrier lifetime of the second layer 257 can be shortened.

As a method for shortening the carrier lifetime of the fourth layer, for example, the addition amount of an impurity may be changed or the growth temperature may be lowered. If the impurity of the fourth layer is set to at most $1 \times 10^{16}$ cm$^{-3}$, the carrier lifetime is shortened since the crystallinity of the fourth layer is degraded and non-radiative recombination is increased. If the impurity concentration of the fourth layer is set to at least $1 \times 10^{20}$ cm$^{-3}$, the carrier lifetime is generally shortened since the radiation transition probability increases and the crystallinity is degraded. As above, by differentiating the impurity concentrations of the fourth and the second layers, the carrier lifetime of the second layer can be shortened to obtain excellent self-pulsation characteristics.

As a method for shortening the carrier lifetime of the fourth layer, for example the growth temperature of the fourth layer may be set to at most the growth temperature of the second layer. Specifically, by lowering the growth temperature thereof by at least 20° C. from the growth temperature conditioned for increasing the luminous efficiency of the active layer, the carrier lifetime is shortened due to the crystallinity of the fourth layer becoming degraded. Thus, the carrier lifetime of the second layer is shortened to obtain excellent self-pulsation characteristics. As a method for shortening the carrier lifetime of the fourth layer, a small amount of p-type impurity may be added in addition to an n-type impurity, simultaneously. Accordingly, the carrier lifetime of the fourth layer is shortened, obtaining excellent self-pulsation characteristics.

Sixth Embodiment

Figure 13A:
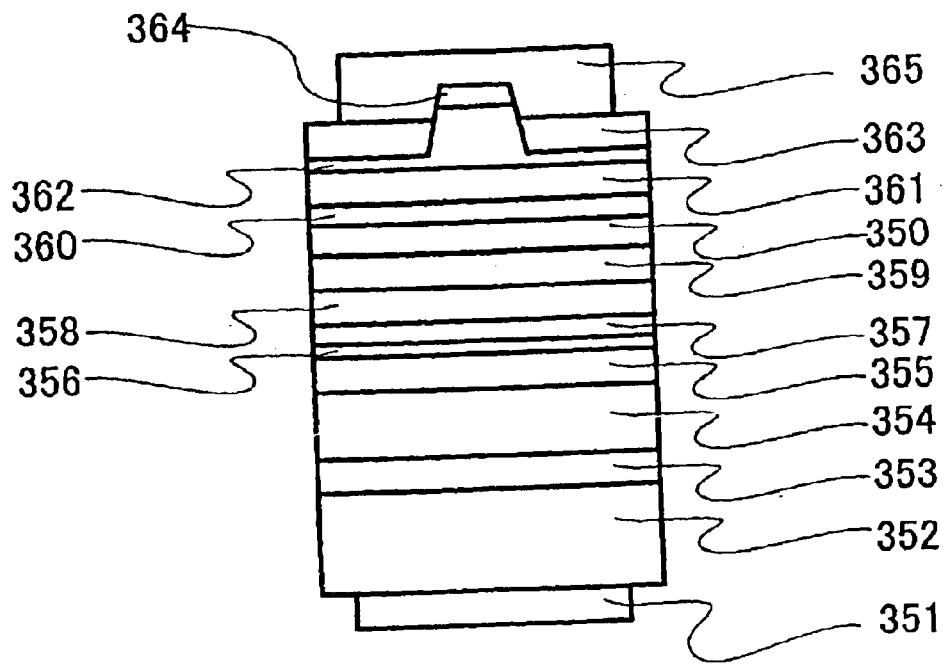
Figure 13B:
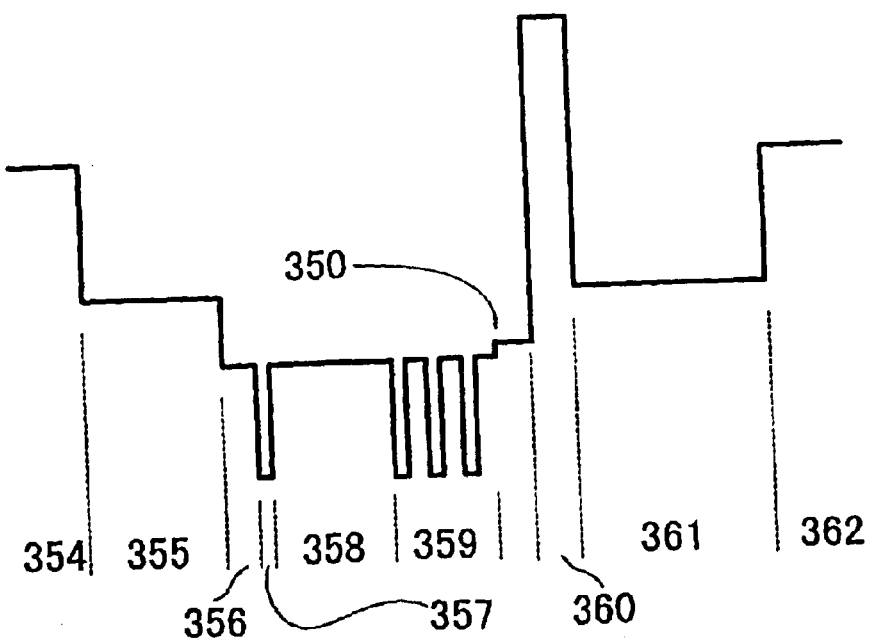
Figure 14:
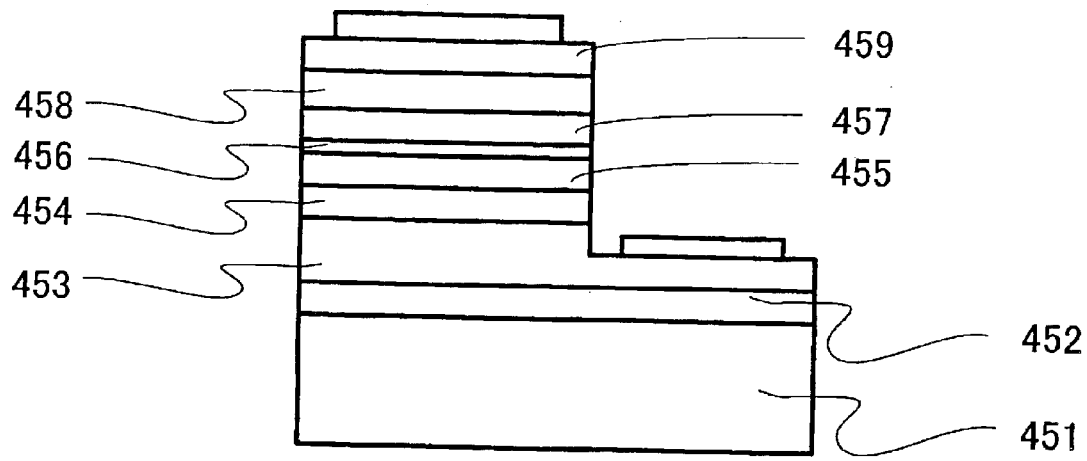
FIG. 14 is a cross sectional view of a conventional nitride semiconductor light emitting element.

In a sixth embodiment, a structure is considered in which a p-InGaN seventh layer is provided between the active layer and the p-type carrier block layer according to a first embodiment. FIG. 13A is a cross sectional view of a semiconductor light emitting element having p-InGaN seventh layer, seen from the direction of a resonator. FIG. 13B is a schematic diagram showing the energy level of each layer in this structure. The light emitting element includes: an n-type electrode 351, an n-GaN substrate 352, an n-GaN layer 353, an n-AlGaN clad layer 354, an n-GaN guide layer 355, an n-InGaN third layer 356, an n-InGaN second layer 357, an n-InGaN first layer 358, an n-InGaN active layer 359, a p-InGaN seventh layer 350, a p-AlGaN carrier block layer 360, a p-GaN guide layer 361, a p-AlGaN clad layer 362, a p-GaN contact layer 363, an insulating layer 364, and a p-type electrode 365.

In the structure of the first embodiment, since the guide layer below the active layer is formed of the nitride semiconductor mainly containing In and Ga while the guide layer above the active layer is formed of the nitride semiconductor mainly containing Ga, the refractive index is different between each other, i.e., the guide layer of the latter has lower refractive index. Due to such an asymmetric guide layers, the light distribution in the vertical direction is pulled toward the substrate side. Since the optical confinement factor of the active layer becomes smaller if the center of light distribution is displaced from the active layer position, the oscillation threshold value increases. On the other hand, the modulation of the photon density is considered to become greater if an n-type saturable absorption layer is provided below the active layer, since the optical confinement factor of the n-type saturable absorption layer can be increased readily. In the present embodiment, in order to solve the problem of increasing threshold value, the light distribution in the vertical direction was studied. As a result, it has been found that the active layer can be positioned closer to the center of the light distribution in the vertical direction by providing a seventh layer formed of a nitride semiconductor mainly containing In and Ga, on and adjacent to the active layer. It is desirable for reducing the threshold value.

It is preferred that the mobility of holes in the seventh layer is made large, and it is effective to add a p-type impurity such as Mg. Additionally, the effect can also be expected with the seventh layer of n-type or a non-doped layer. On the other hand, a p-type nitride layer containing In and Ga was provided after the growth of p-type carrier block layer, with the temperature of the substrate being lowered. As a result, when it was operated at most at the threshold value, the full width at half maximum of spontaneous emission became wider and a unimodal spectrum could not be attained. Additionally, the threshold value increased. It is assumed to be caused by In segregation occurring in the active layer due to the temperature hysteresis after the growth of the active layer.

Seventh Embodiment

In the seventh embodiment, the growth condition in the vicinity of the second layer of the first embodiment is considered. First, if the thickness $L_3$ of n-InGaN third layer 6 is made thicker than 20 nm as shown in FIG. 1A, the nitride semiconductor laser thus manufactured still self-pulsates, but the range of light output in which self-pulsation is observed becomes narrower. There may be several causes for such a phenomenon, and in the present embodiment, it is assumed that it is caused by the carrier lifetime of the second layer 7 becoming longer. Specifically, excellent self-pulsation can be attained when $$0 \leq L_3 \leq 20 \text{ nm}$$

and when the top surface of the third layer is positioned adjacent to the second layer and the bottom surface thereof is positioned adjacent to a layer mainly containing Al and Ga or a layer mainly containing Ga. It should be noted that a p-type impurity can also be added to n-InGaN third layer 6. Thus, laser light is absorbed to facilitate the tunneling of the carriers generated in the second layer to the third layer, and the carrier lifetime of the second layer can be shortened.

Eighth Embodiment

Figure 18:
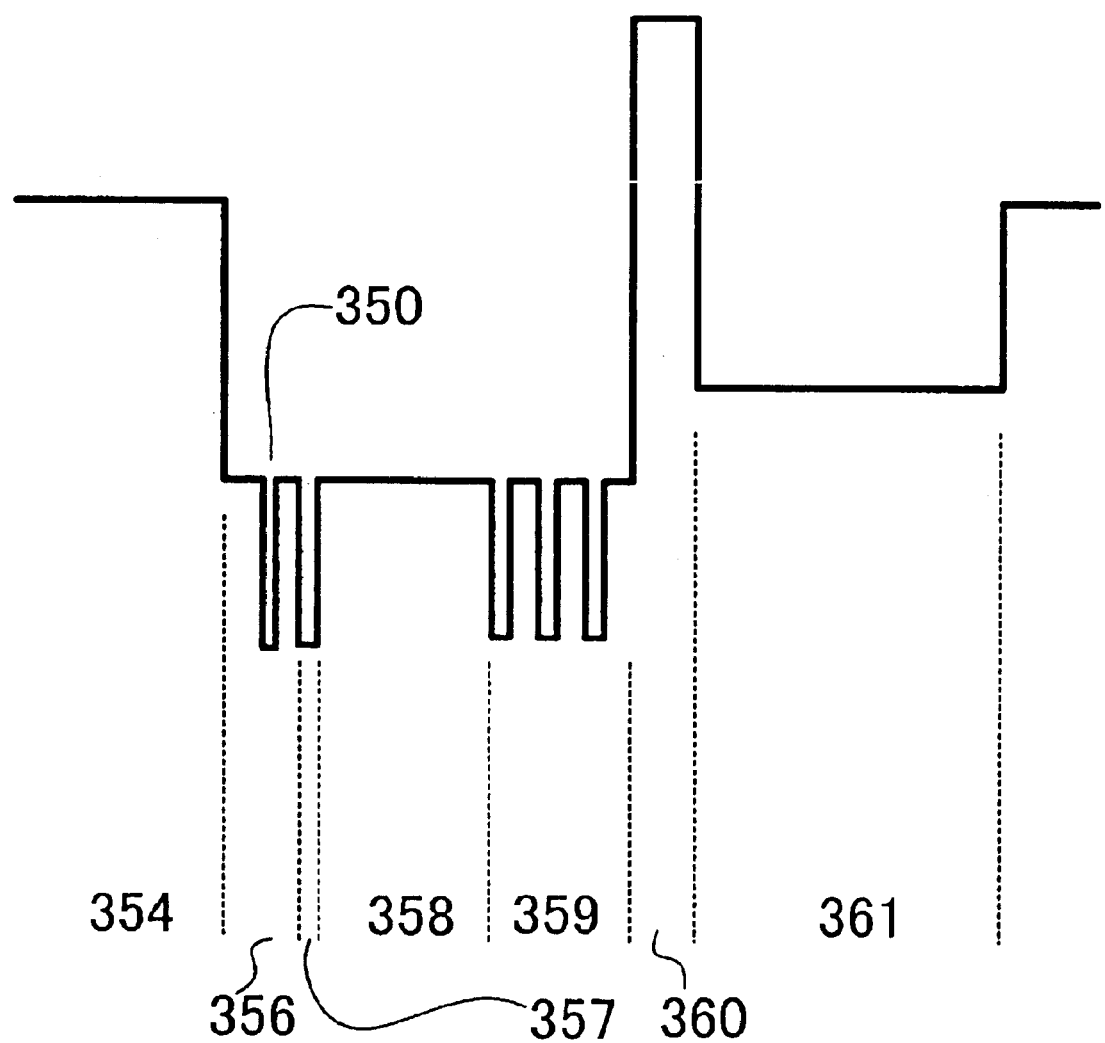
FIG. 18 shows a semiconductor light emitting element according to an eighth embodiment of the present invention.

In the eighth embodiment, a case in which the fourth layer in the fifth embodiment is utilized as a saturable absorption layer is considered. FIG. 18 is a schematic diagram showing the energy level of each layer. The light emitting element includes: an n-AlGaN clad layer 354, an n-InGaN third layer 356, an n-InGaN fourth layer 350, an n-InGaN second layer 357, an n-InGaN first layer 358, an n-InGaN active layer 359, a p-AlGaN carrier block layer 360, and a p-GaN guide layer 361. By using the fourth layer 350 as a saturable absorption layer, in cooperation with the second layer, the absorption characteristics can easily be controlled. By differentiating the absorption characteristics between the second and fourth layers, a nitride semiconductor laser that attains self-pulsation from low output to high output can be obtained. It should be noted that the fourth layer functions as the saturable absorption layer is formed according to the second layer of the first embodiment.

Ninth Embodiment

Figure 19A:
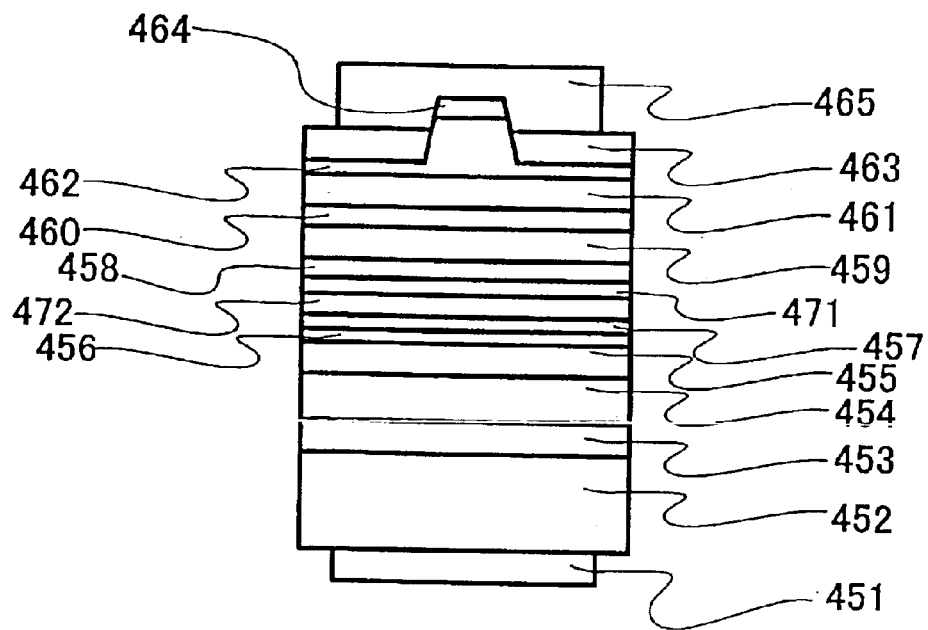
FIGS. 19A and 19B show a semiconductor light emitting element according to a ninth embodiment of the present invention.
Figure 19B:
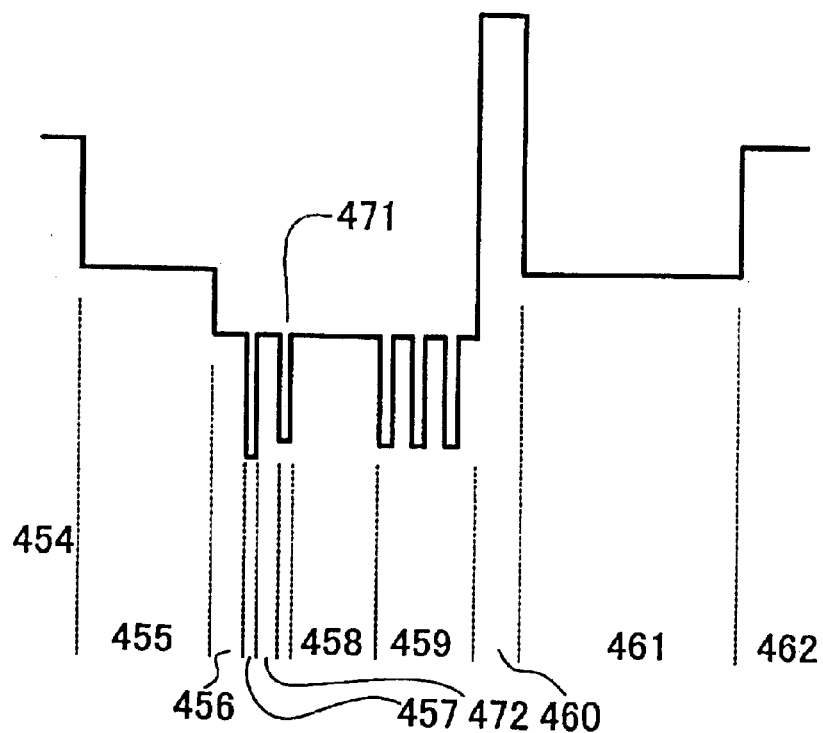

In the ninth embodiment, a case is considered where, between the first layer and the second layer according to the first embodiment, a fifth layer higher in In content than the first layer, and a sixth layer lower in In content than the fifth and second layers are successively stacked from the active layer side. FIG. 19A is a cross sectional view of a semiconductor laser element seen from the direction of a resonator. FIG. 19B is a schematic diagram showing the energy level of each layer. This light emitting element includes: an n-type electrode 451, an n-GaN substrate 452, an n-GaN layer 453, an n-AlGaN clad layer 454, an n-GaN guide layer 455, an n-InGaN third layer 456, an n-InGaN second layer 457, an n-InGaN first layer 458, an n-InGaN active layer 459, a p-AlGaN carrier block layer 460, a p-GaN guide layer 461, a p-AlGaN clad layer 462, a p-GaN contact layer 463, an insulating layer 464, and a p-type electrode 465, and further includes a fifth layer 471 and a sixth layer 472 between first layer 458 and second layer 457.

In the first embodiment, the second layer also serves to alleviate the distortion of the active layer affected by the substrate, the n-AlGaN clad layer and the n-GaN guide layer, and fifth layer 471 according to the ninth embodiment is for supporting such an effect. The substantial bandgap of fifth layer 471 is greater than that of the active layer, and absorption coefficient to laser light is very small.

Specifically, $$Eg_0 - 0.05 \text{ eV} < Eg_5$$

and $$In_{(x)1} < In_{(x)5}$$

and $$In_{(x)6} < In_{(x)5}$$

and $$In_{(x)0} - 0.10 < In_{(x)5} < In_{(x)0} + 0.10$$

may be satisfied, where $Eg_5$ is the substantial bandgap of fifth layer 471, and $In_{(x)5}$ is In content thereof.

The nitride semiconductor laser thus manufactured facilitates to narrow the full width at half maximum of spontaneous emission observed in the operation at most at the threshold value and stable self-pulsation characteristics can be expected, as compared to the first embodiment. While fifth layer 471 is formed of a single quantum well in the ninth embodiment, it may be formed of a multiple quantum well structure, or may be formed of a plurality of layers of different substantial bandgaps. In those cases, each of the layers may satisfy the condition of $Eg_5$ and $In_{(x)5}$.

Next, the position of the fifth layer is changed. The distance $L_5$ between the top of the fifth layer (p-electrode side) and the bottom of the active layer (the edge of well layer at n-electrode side) is examined and when $$L_5 < 20 \text{ nm}$$

spontaneous emission (EL: electroluminescence) from the fifth layer is observed when injecting a current. Normally, though the mobility of holes in n-InGaN first layer 458 is small, the injected holes seems to enter into fifth layer 471 in this range. As it raises the threshold value, the above mentioned $L_5$ is desirably as follows:

$$L_5 \geq 20 \text{ nm}$$

It is preferable that sixth layer 472 is smaller in In content than fifth layer 471 and second layer 457. The nitride semiconductor laser thus manufactured is expected to attain more stable self-pulsation characteristics than the first embodiment.

Since fifth layer 471 is positioned in the vicinity of second layer 457 that functions as a saturable absorption layer, it is expected that it absorbs laser light so that carriers generated in second layer 457 tunnel to fifth layer 471. When the carrier lifetime of fifth layer 471 is short, the self-pulsation is facilitated since the carrier lifetime of the second layer 457 can be shortened. As a method for shortening the carrier lifetime of the fifth layer, for example, the addition amount of an impurity may be changed, or the growth temperature may be lowered. If the impurity of fifth layer is set to at most $1\times10^{16}$ cm$^{-3}$, the carrier lifetime is shortened since the crystallinity of the fifth layer is degraded and non-radiative recombination is increased. If the impurity concentration of the fifth layer is set to at least $1\times10^{20}$ cm$^{-3}$, the carrier lifetime is generally shortened since the radiation transition probability increases and the crystallinity is degraded. As above, by differentiating the impurity concentrations of the fifth and second layers, the carrier lifetime of the second layer can be shortened to obtain excellent self-pulsation characteristics.

As a method for shortening the carrier lifetime of the fifth layer, the growth temperature of the fifth layer may be lowered to at most the growth temperature of the second layer. Specifically, by lowering the growth temperature thereof by at least 20° C. from the growth temperature conditioned for increasing the luminous efficiency of the active layer, the carrier lifetime is shortened due to the crystallinity of the fifth layer becoming degraded. Thus, the carrier lifetime of the second layer is shortened to obtain excellent self-pulsation characteristics. As a method for shortening the carrier lifetime of the fifth layer, a small amount of p-type impurity may be added in addition to an n-type impurity, simultaneously. Accordingly, the carrier lifetime of the fifth layer is shortened, obtaining excellent self-pulsation characteristics.

Tenth Embodiment

Figure 20:
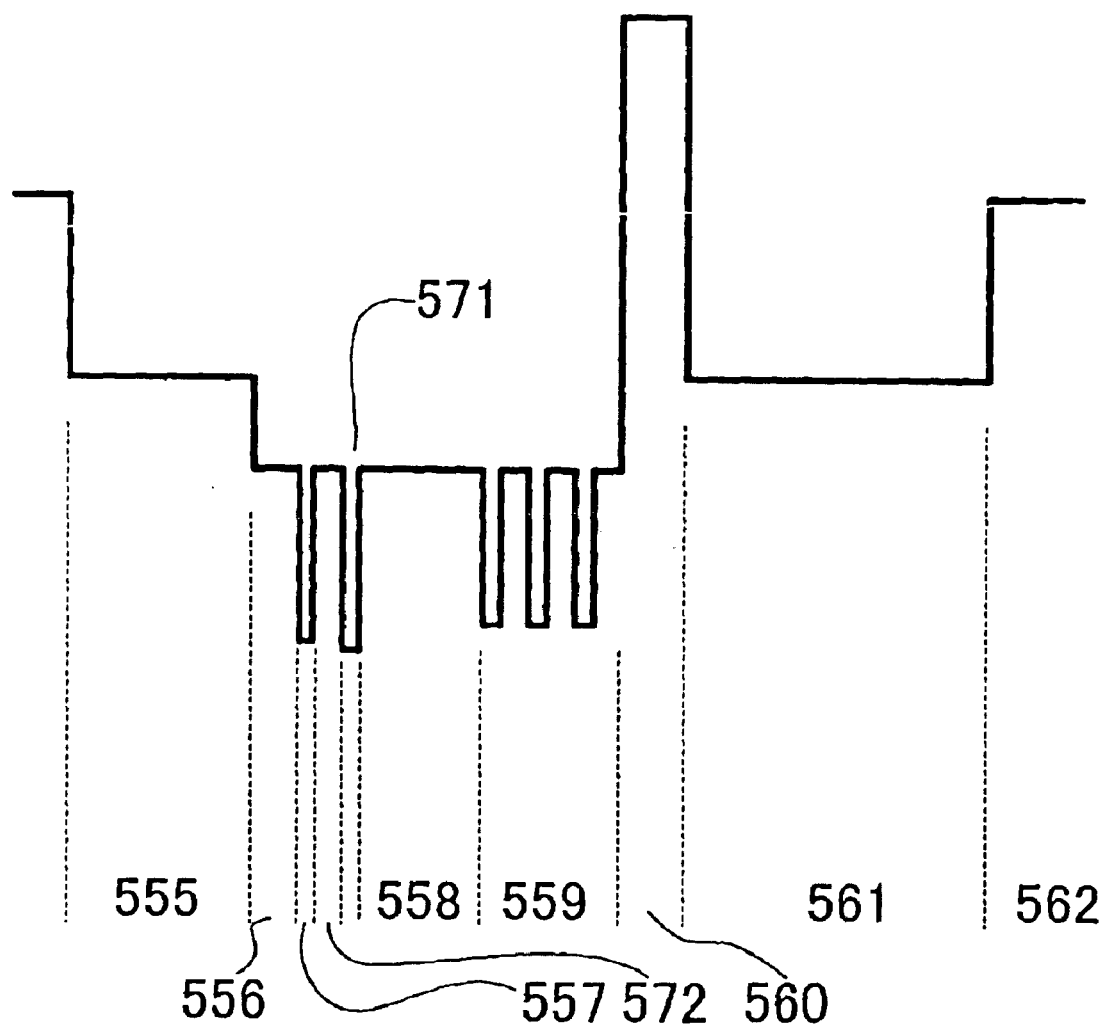
FIG. 20 shows a semiconductor light emitting element according to a tenth embodiment of the present invention.
Figure 21:
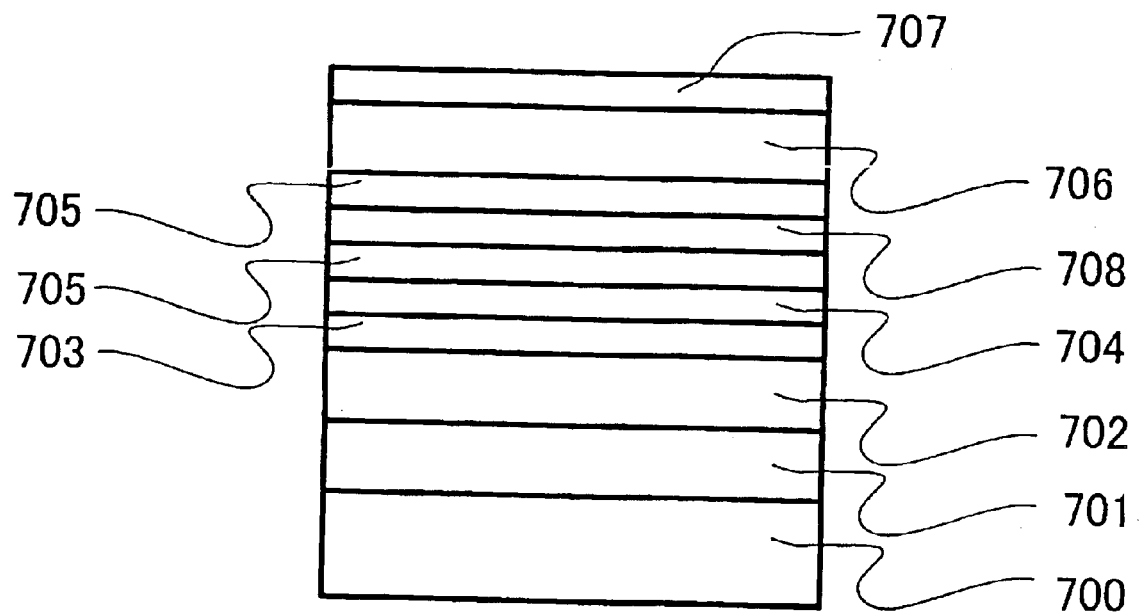
FIG. 21 shows a conventional semiconductor light emitting element.

In the tenth embodiment, a case is considered where the second layer according to the ninth embodiment is utilized as a saturable absorption layer. FIG. 20 is a schematic diagram showing the energy level of each layer. The light emitting element includes: n-GaN guide layer 555, n-InGaN third layer 556, n-InGaN second layer 557, n-InGaN first layer 558, n-InGaN active layer 559, p-AlGaN carrier block layer 560, p-GaN guide layer 561, p-AlGaN clad layer 562. It further includes a fifth layer 571 and a sixth layer 572 between first layer 558 and second layer 557.

By using fifth layer 571 as a saturable absorption layer, in cooperation with second layer 557, the absorption characteristics can easily be controlled. By differentiating the absorption characteristics between the second layer 557 and fifth layer 571, a nitride semiconductor laser that attains self-pulsation from low output to high output can be obtained. Note that the fifth layer functioning as a saturable absorption layer is formed according to the second layer of the first embodiment.

Eleventh Embodiment

In the eleventh embodiment, a case is considered where the growth is interrupted in the process of growing the n-InGaN third layer in the vicinity of the second layer according to the first embodiment, and a thermal hysteresis is provided. The surface where the growth is interrupt (hereinafter referred to as "growth interruption interface") tends to invite In segregation, increasing a non-radiative recombination probability. As for temperature variation during the interruption of the growth, the temperature may first be lowered and then raised or it may first be raised and then lowered, or several temperature variations may be introduced. Though it is less effective than the above mentioned effect, the temperature may be held constant during the interruption. The interruption period is not limited to 60 seconds. During the growth interruption, it is only required that a group III material do not flow substantially, and for example, the impurity material may flow, or it may be stopped. Additionally, a group V material may flow or it may be stopped.

Next, the distance $L_4$ between the second layer and the growth interruption interface is considered. The distance as used herein refers to a thickness from a portion stacked after the interruption of the growth to the lowermost portion of the second layer. As a result, $L_4$ is desirably 0 nm–20 nm, and more desirably 2 nm–10 nm. Further, it is preferable that at least one growth interruption interface is present. Next, the growth interruption interface is provided above the second layer. As a result of the study, the similar effect can be expected, and the distance from the top of the n-type saturable absorption layer to the growth interruption interface is preferably 0 nm–20 nm, and more preferably 2 nm–10 nm. While the third to eleventh embodiments respectively have characterized configurations in addition to the configuration of the first embodiment, their respective effects do not conflict one another and the effect of the present invention is expected to be attained.

EXAMPLE

Example 1

In the present example, a nitride semiconductor light emitting element as shown in FIG. 1A was manufactured. First, n-GaN substrate 2 was set on MOCVD apparatus, and a GaN buffer layer was grown by 25 nm at a growth temperature of 550° C., using NH$_3$ of group V material and TMGa of group III material. Next, n-GaN layer 3 (Si impurity concentration $1\times10^{18}$/cm$^3$) was formed by 3 μm, at a growth temperature of 1075° C., adding SiH$_4$ to the material. Subsequently, n-Al$_{0.1}$Ga$_{0.9}$N clad layer 4 (Si impurity concentration $1\times10^{18}$/cm$^3$) having a thickness of 1.5 μm was grown, using TMAl of group III material. Subsequently, n-GaN guide layer 5 was grown by 0.05 μm.

Thereafter, the substrate temperature was lowered to 725° C., and n-In$_{0.02}$Ga$_{0.98}$N third layer 6 (non-doped) was grown by 8 nm, then keeping the temperature substantially constant, n-In$_{0.14}$Ga$_{0.86}$N second layer 7 (non-doped) was grown by 4 nm, and then n-In$_{0.02}$Ga$_{0.98}$N first layer 8 (non-doped) was grown by 46 nm. The growth interruption of at least 1 second and at most 180 seconds may be introduced after the growth of the second layer, or during the growth process of the third to first layers with intervals of several nm. Thus, the evenness of each layer is improved, and the full width at half maximum of light emission decreases. Third layer 6, second layer 7, first layer 8 may be added with Si in an approximate range of impurity concentration $1\times10^{17}$/cm$^3$–$1\times10^{22}$/cm$^3$, respectively.

Thereafter, the active layer of three cycles (multiple quantum well structure) 9, formed of In$_{0.15}$Ga$_{0.85}$N well layer of 4 nm in thickness and In$_{0.02}$Ga$_{0.98}$N barrier layer of 8 nm in thickness, was grown in order of well layer/barrier layer/well layer/barrier layer/well layer/barrier layer. The growth interruption of at least 1 second and at most 180 seconds may be introduced between the barrier layer and the well layer, or between the well layer and the barrier layer. Thus, the evenness of each layer is improved and the full width at half maximum of light emission is reduced.

Thereafter, the substrate temperature is raised to 1050° C. again, and p-Al$_{0.3}$Ga$_{0.7}$N carrier block layer 10 of 18 nm in thickness, and p-GaN guide layer 11 of 0.1 μm thickness were grown. Additionally, as a p-type impurity, Mg was added by $1\times10^{20}$/cm$^3$. Subsequently, holding the substrate temperature at 1050° C., p-Al$_{0.1}$Ga$_{0.9}$N clad layer 12 of 0.5 μm in thickness, and p-GaN contact layer 13 of 0.1 μm in thickness were grown. As a p-type impurity, Mg was added by $1\times10^{20}$/cm$^3$. As each material of element constituting each layer and of dope elements, TMGa, TMAl, TMIn, NH$_3$, Cp$_2$Mg, SiH$_4$ were used.

After forming p-GaN contact layer 13, a ridge structure was formed by dry etching process, and p-type electrode 15 formed of Pd/Mo/Au was formed on the upper surface of insulating layer 14. While $SiO_2$ was used for the insulating layer, a layer selected from $ZrO_2$, SiO, $Ta_2O_5$, $TiO_2$, $Al_2O_3$, and the like, or the mixture thereof may be employed. Further, a semiconductor such as AlGaN can be employed for adjusting the refractive index. Thereafter, part of the substrate is removed by polishing or by etching from the back side of GaN substrate 2, to prepare a thin wafer having a thickness of approximately 100 μm–200 μm. This process is for facilitating a later process of dividing the wafer into individual laser chips. In special, when a laser end surface mirror is also formed in the dividing process, it is desirable to be prepared in a thickness of approximately 80 μm–150 μm. In a present example, while the thickness of the wafer was prepared to be approximately 120 μm using both of a grinding machine and a polishing machine, it may be prepared only with the polishing machine. The back surface of the wafer was polished by the polishing machine to have an even surface.

After the polishing, a thin metal film was deposited on the back surface of GaN substrate 2 to form n-type electrode 1. n-type electrode 1 was designed to have a layer structure in which Hf/Al/Mo/Pt/Au layers were successively stacked from the substrate side. The vacuum deposition method is suitable in order to form such a thin metal layer controlling the thickness, and the vacuum deposition method is employed in the present Example as well. It should be noted that other method such as an ion plating method or a sputtering method may be employed as well. In order to improve the characteristics of p-type and n-type electrodes, annealing process was carried out at 500° C. after forming the metal films to obtain excellent ohmic electrodes. The annealing process can be carried out after forming the p-type electrode and after the formation of n-type electrodes, respectively, and Mo/Pt/Au may be formed after forming Hf/Al in n-type electrode.

Semiconductor light emitting element thus manufactured was divided according to the following method. First, a scribe line was provided on the surface of a wafer with a diamond point, and force was exerted to the wafer as appropriate to divide it along the scribe line. The scribe line may be provided from the back surface of the wafer. Other methods can be employed to divide the wafer into chips, such as a dicing method in which a wire saw or a thin plate blade is used to provide scribing or cutting, a laser scribing method in which a wafer is irradiated and heated by laser light of an excimer laser or the like and then quenched to have a crack as a scribe line on the irradiated portion, or a laser abrasion method in which a wafer is irradiated by laser light of high energy density and then the irradiated portion is vaporized to achieve grooving process.

After the division, a multilayered film of a dielectric material was provided to the end forming a Fabry-Perot cavity to change the reflectance. Such a reflecting film is to be formed in accordance with the system, and therefore it is not determined specifically, but generally a back surface reflecting film of at least 80% is desirably provided at the back surface. In special, when a light receiving element for detecting the light output is not provided behind the back surface, a reflecting film of at least 90% may be provided. Thus, oscillating threshold value is reduced since the photon density in the semiconductor light emitting element is improved. Such a high reflecting film may be formed using materials of low refractive index and high refractive index alternatively in a thickness of 4/λ, using $SiO_2$, $TiO_2$, $Ta_2O_5$, $Al_2O_3$, $ZrO_2$ and the like.

In order to improve the external differential efficiency, the reflectance of the end surface at a light outputting surface side may be lowered. However, it is difficult to design a low reflecting film with less wavelength dispersion as compared to a high reflecting film. In special, in wavelength in the vicinity of 405 nm, the designing is facilitated by providing a multilayered film formed of at least three materials in which SiO or the mixture of $TiO_2$ and $ZrO_2$ and the like are added to the above mentioned dielectric. On the other hand, considering the noise characteristics at low output, it is advantageous to increase the reflectance of the end surface formed of the cleavage plane by approximately 22%, and therefore a front side reflecting film of at most 50% may be provided.

Next, the laser chip was mounted on a heat sink by the die bonding method to obtain a semiconductor laser apparatus. The chip was bonded firmly by a junction-up bonding in which n-type electrode side is applied as a junction face. As used herein, the heat sink refers to a stem or the like. Additionally, a junction-down bonding in which p-type electrode side is applied as junction face may be employed, and in this case the structure of the p-type electrode may be Pd/Mo/Pt/Au, or Pd/Mo/Ni/Au.

Figure 2:
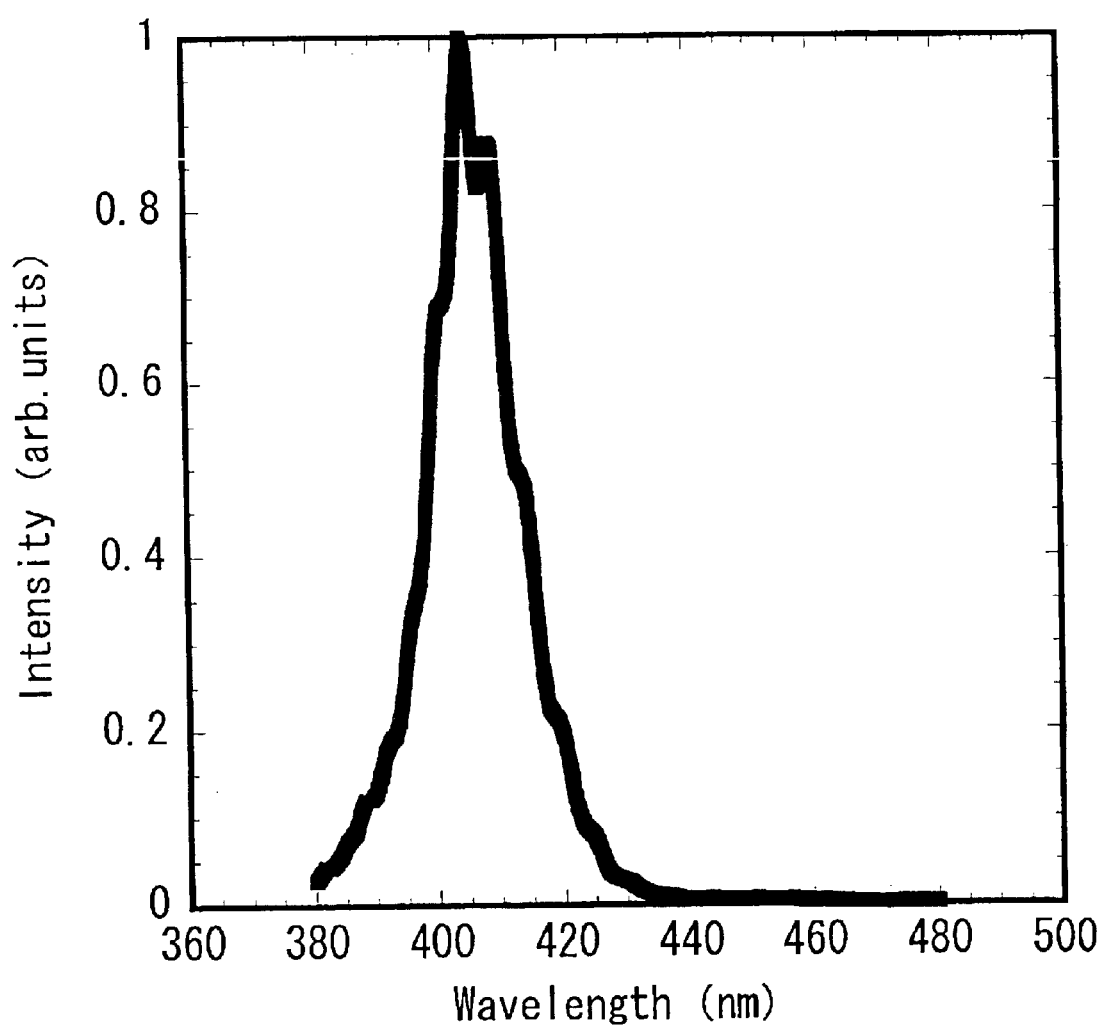
FIG. 2 shows the spectrum of spontaneous emission of a nitride semiconductor light emitting element according to Example 1 of the present invention.

The various characteristics of the nitride semiconductor light emitting element thus manufactured were examined. The nitride semiconductor light emitting element was designed to have a resonator length of 500 μm and a stripe width of 1.5 μm. It continuously oscillated at a room temperature of 25° C. with a threshold value of 33 mA, and the oscillation wavelength was 405±5 nm. The element was operated at most at the threshold value, and the spectrum of spontaneous emission shown in FIG. 2 was observed. The full width at half maximum of spontaneous emission was observed to be 13.5 nm, and almost no light emission was observed at 440 nm and above.

Comparative Example 1

Figure 4:
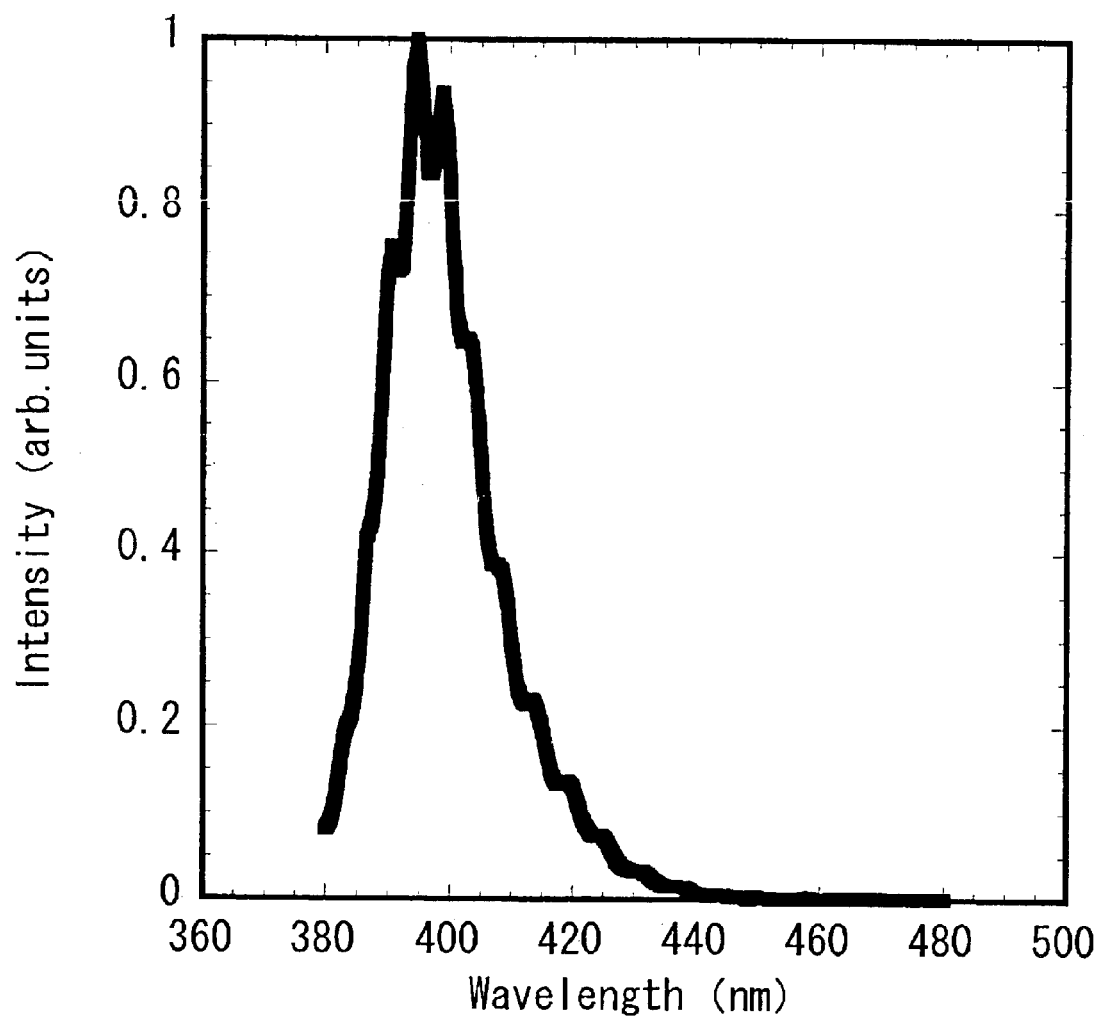
FIG. 4 shows the spectrum of spontaneous emission of a nitride semiconductor light emitting element according to Comparative Example 1.

A nitride semiconductor light emitting element was manufactured similarly as Example 1, except that the second layer as in Example 1 was omitted, to observe various characteristics. As a result, the element continuously oscillated at a room temperature of 25° C. with a threshold value of 42 mA, and oscillation wavelength was 405±5 nm. This element was operated at most at the threshold value, and the spectrum of the spontaneous emission shown in FIG. 4 was observed. The full width at half maximum of spontaneous emission was observed to be 17.5 nm, and the light emission intensity was reduced. The increase in oscillation threshold was considered to be the result of degradation of the crystallinity of the active layer, or the change in the distortion.

Example 2

First, a GaN substrate is set on MOCVD apparatus, and a low temperature GaN buffer layer was grown by 25 nm at a growth temperature of 550° C., using $NH_3$ of group V material and TMGa of group III material as shown in FIG. 1A. Next, n-GaN layer 3 (Si impurity concentration $1\times10^{18}$/$cm^3$) was formed by 3 μm on n-GaN substrate 2 at a growth temperature of 1075° C., adding $SiH_4$ to the material. Subsequently, using TMAl of group III material, n-$Al_{0.1}Ga^{0.9}N$ clad layer 4 (Si impurity concentration. $1\times10^{18}/cm^3$) was grown by a thickness of 0.95 μm, and subsequently, n-GaN guide layer 5 was grown by 0.05 μm.

Next, the substrate temperature was lowered to 725° C., and n-$In_{0.02}Ga_{0.98}N$ third layer 6 (Si impurity concentration $1\times10^{18}/cm^3$) was grown by 4 nm, and holding the temperature substantially constant, n-$In_{0.18}Ga_{0.82}N$ second layer 7 was grown by 4 nm, and subsequently, n-$In_{0.02}Ga_{0.98}N$ first layer 8 (Si impurity concentration $1\times10^{18}/cm^3$) was grown by 46 nm. The growth interruption of at least 1 second and at most 180 seconds may be introduced after the growth of n-type saturable absorption layer. Thus, the improvement in the evenness of each layer is expected to be attained. The second layer 7 functioned as a saturable absorption layer.

Subsequently, in three cycles, active layer (multiple quantum well structure) 9, formed of $In_{0.15}Ga_{0.85}N$ well layer of 4 nm in thickness and $In_{0.02}Ga_{0.98}N$ barrier layer of 8 nm in thickness, was grown in order of well layer/barrier layer/well layer/barrier layer/well layer/barrier layer. The growth interruption of at least 1 second and at most 180 seconds may be introduced between the barrier layer and the well layer, or between the well layer and the barrier layer. Thus, the evenness of each layer is improved and the width at half maximum of light emission is reduced.

Thereafter, the nitride semiconductor light emitting element was manufactured following subsequent processes of Example 1, and various characteristics thereof were examined. Since the n-type saturable absorption layer tends to enter into a supersaturation state if the internal photon density increases excessively, the reflectance of the end surface at a light outputting surface side may be lowered. In special, the front side light reflecting film may be adjusted in order to obtain self-pulsation characteristics at high output.

Figure 15:
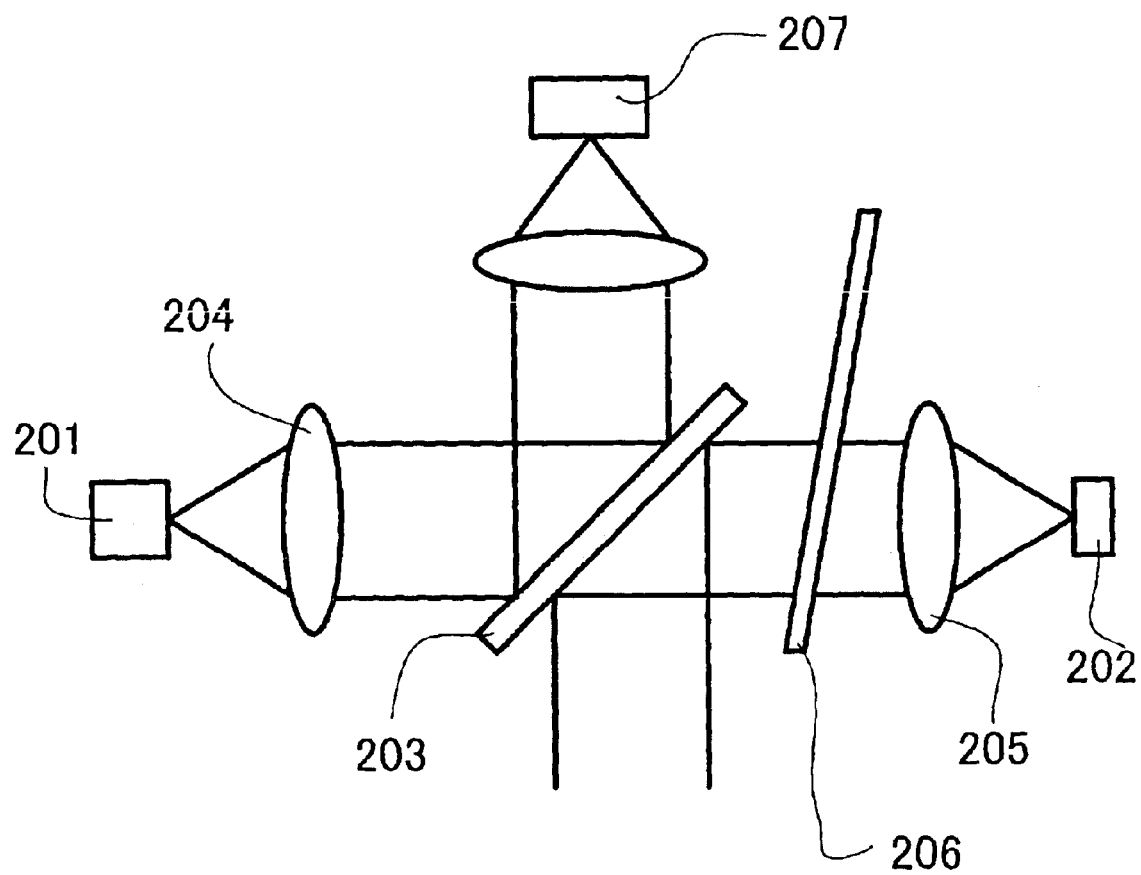
FIG. 15 shows a tester used in measurement of noise levels.

The nitride semiconductor light emitting element was designed to have a resonator length of 500 μm and a stripe width of 1.5 μm. The light emitting element continuously oscillated at a room temperature of 25° C. and a threshold value of 35 mA, and oscillation wavelength was 405±5 nm. As a result of the examination of FFP (Far Field Pattern), it was oscillated in a normal mode in both of the horizontal direction and the vertical direction relative to the layered surface. Next, the noise measurement was carried out with a system having optical feedback. Generally, such a system with an optical feedback is employed in an optical information recording apparatus such as an optical disk system. FIG. 15 is an illustration modeling such a system. In a system with optical feedback, the dominant noise is attributed to the phenomenon in which the laser light output from the semiconductor laser is coupled again thereto as a feedback light (generally referred to as optical feedback noise). As for the noise evaluation of the system, the relative intensity noise (RIN) was employed. Generally, an excellent system standard is RIN<−125 dB/Hz.

As shown in FIG. 15, laser light output from a semiconductor laser 201 is collimated at a lens 204, and divided at a half mirror 203 into two beams. The transmitted light passes through an ND filter 206 and a lens 205, and condensed to a reflecting mirror 202. The reflecting mirror is equivalent to an optical disk or the like, and reflectance thereof can be changed by the ND filter. The reflected light feeds back through this optical path, and condensed to semiconductor laser 201. As above, the noise measurement apparatus is a device that replaces a system in which a semiconductor laser is mounted on an optical disk, and it is capable of measuring relative intensity noise including optical feedback noise. The light output was observed with a light receiving element 207. The nitride semiconductor laser was evaluated using such a noise measurement apparatus. As a result, at the light output of 5 mW, RIN<−130 dB/Hz was attained. Further, the laser light was observed using a high speed detector and it has been found to have a periodic fluctuation.

This element was operated at most at the threshold value to observe spectrum of spontaneous emission. The full width at half maximum of spontaneous emission was found to be 14.5 nm, and the form of spectrum was unimodal. If the active layer is involved with distortion, the fluctuation in the In composition due to thermal hysteresis or the like, the spectrum of spontaneous emission when the element was operated at most at the threshold value as described above will not be unimodal, and a sub peak may appear for example in the vicinity of 420 nm to 440 nm. Such an active layer is considered to have weak coupling of excited carriers for stimulated emission, which result in smaller differential gain. When the differential gain of the active layer is small, the time differentiation of photon density during laser oscillation becomes smaller. As such, a phenomenon such as self-pulsation becoming difficult, modulation amount of photon density during self-pulsation becoming smaller, or fluctuation in oscillation frequency arising, may be possible. Considering noise affecting the system, the modulation amount of photon density or the oscillation frequency at self-pulsation should be designed within an appropriate acceptable range. Accordingly, a structure that allows such parameters to increase is desirable.

Comparative Example 2

In Comparative Example 2, a semiconductor light emitting element was manufactured similarly to Example 2, except that n-InGaN first layer 8 of the Example 2 was changed to n-GaN, and the growth temperature is changed to 1050° C., and various characteristics thereof were examined. As a result, the element continuously oscillated at a room temperature of 25° C. at 42 mA. When in was operated at most at the threshold value, the full width at half maximum of spontaneous emission was 17 nm. The observation was made on several elements, and some of them provided spectrum of spontaneous emission not being unimodal. Much variations were found in the noise characteristics of the nitride semiconductor lasers thus manufactured, and as measured by the noise measurement apparatus, yield of the elements satisfying RIN<−125 dB/Hz was decreased.

Example 3

In Example 2, after the growth of n-GaN guide layer 5, the substrate temperature was lowered to 725° C., and then the interruption was introduced at the point where n-$In_{0.02}Ga_{0.98}N$ third layer (Si impurity concentration $1\times10^{18}/cm^3$) was grown by 16 nm. Thereafter, the substrate temperature was raised to 900° C., and then quickly lowered to 725° C. The period from the initiation of temperature rise to the end of temperature drop was approximately 60 seconds. Thereafter, the light emitting element was obtained as in Example 2, except that n-$In_{0.02}Ga_{0.98}N$ was grown by 4 nm to obtain n-$In_{0.02}Ga_{0.98}N$ third layer of 20 nm in thickness. The light emitting element thus obtained has wider range of light output that produces self-pulsation as compared to Example 2. It is considered because of the carriers generated in second layer 7 being alleviated by tunnel effect from the growth interruption interface.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A nitride semiconductor light emitting element, comprising:
   a substrate;
   a lower clad layer formed of a nitride semiconductor containing Al and Ga stacked thereon;
   a lower guide layer formed of a nitride semiconductor mainly containing In and Ga stacked thereon; and
   an active layer including a nitride semiconductor mainly containing In and Ga stacked thereon; wherein
   said lower guide layer has a first layer and a second layer higher in In content than said first layer, successively stacked from the active layer side.

2. The nitride semiconductor light emitting element according to claim 1, wherein $$L_1 \geq 20 \text{ nm},$$

wherein $L_1$ is a distance from said second layer to a well layer at the substrate side in said active layer.

3. The nitride semiconductor light emitting element according to claim 1, wherein
   said active layer is a quantum well active layer, wherein $$In_{(x)2} - 0.10 \leq In_{(x)0} \leq In_{(x)2} + 0.10$$

wherein $In_{(x)2}$ is In content of said second layer and $In_{(x)0}$ is In content of a well layer in said active layer.

4. The nitride semiconductor light emitting element according to claim 1, wherein
   said first layer is lower in In content than a well layer in said active layer.

5. The nitride semiconductor light emitting element according to claim 1, wherein
   said lower guide layer has a first layer, a second layer and a third layer lower in In content than said second layer, successively stacked from the active layer side.

6. The nitride semiconductor light emitting element according to claim 5, wherein
   said third layer has a fourth layer higher in In content than said third layer.

7. The nitride semiconductor light emitting element according to claim 1, wherein
   said second layer is a multiple quantum well layer, wherein $$In_{(x)2}' - 0.10 \leq In_{(x)0} \leq In_{(x)2}' + 0.10$$

wherein $In_{(x)2}'$ is In content of a well layer in said second layer and $In_{(x)0}$ is In content of a well layer in said active layer.

8. The nitride semiconductor light emitting element according to claim 1, further comprising
   a seventh layer formed of a nitride semiconductor mainly containing In and Ga on and adjacent to said active layer.

9. The nitride semiconductor light emitting element according to claim 1, wherein
   said second layer functions as a saturable absorption layer.

10. The nitride semiconductor light emitting element according to claim 9, wherein
    said lower guide layer has a first layer, a second layer, and a third layer lower in In content than said second layer, successively stacked from the active layer side.

11. The nitride semiconductor light emitting element according to claim 10, wherein $$0 \text{ nm} \leq L_3 \leq 20 \text{ nm},$$

wherein $L_3$ is a thickness of said third layer.

12. The nitride semiconductor light emitting element according to claim 10, wherein
    said third layer has a fourth layer higher in In content than said third layer.

13. The nitride semiconductor light emitting element according to claim 12, wherein
    said fourth layer functions as a saturable absorption layer.

14. The nitride semiconductor light emitting element according to claim 12, wherein
    said second layer and said fourth layer are different in impurity concentration.

15. The nitride semiconductor light emitting element according to claim 9, wherein $$L_1 \geq 20 \text{ nm},$$

wherein $L_1$ is a distance from said second layer to a well layer at the substrate side in said active layer.

16. The nitride semiconductor light emitting element according to claim 9, wherein $$0.5 \text{ nm} \leq L_2 \leq 5.0 \text{ nm},$$

wherein $L_2$ is a thickness of said second layer.

17. The nitride semiconductor light emitting element according to claim 9, wherein
    said first layer is greater in substantial bandgap than said active layer.

18. The nitride semiconductor light emitting element according to claim 9, wherein
    said active layer is a quantum well active layer, wherein $$Eg_2 - 0.02 \text{ eV} \leq Eg_0 \leq Eg_2 + 0.15 \text{ eV, and}$$

$$In_{(x)2} - 0.10 \leq In_{(x)0} \leq In_{(x)2} + 0.10,$$

wherein $In_{(x)2}$ is In content of said second layer, $Eg_2$ is substantial bandgap of said second layer, $In_{(x)0}$ is In content of said active layer, and $Eg_0$ is substantial bandgap of said active layer.

19. The nitride semiconductor light emitting element according to claim 9, wherein
    said second layer is a multiple quantum well.

20. The nitride semiconductor light emitting element according to claim 19, wherein $$Eg_2' - 0.02 \text{ eV} \leq Eg_0 \leq Eg_2' + 0.15 \text{ eV, and}$$

$$In_{(x)2}' - 0.10 \leq In_{(x)0} \leq In_{(x)2}' + 0.10,$$

wherein $Eg_2'$ is substantial bandgap of said second layer, $In_{(x)2}'$ is In content of a well layer in said second layer, $In_{(x)0}$ is In content of said active layer, and $Eg_0$ is substantial bandgap of said active layer.

21. The nitride semiconductor light emitting element according to claim 19, wherein $$0.5 \text{ nm} \leq L_2' \leq 5.0 \text{ nm},$$

wherein $L_2'$ is a thickness of one well layer in said second layer of a multiple quantum well.

22. The nitride semiconductor light emitting element according to claim 9, further comprising
a fifth layer and a sixth layer successively stacked from the active layer side between said first layer and said second layer, wherein
said fifth layer is higher in In content than said first layer, and said sixth layer is lower in In content than said fifth layer and said second layer.

23. The nitride semiconductor light emitting element according to claim 22, wherein $L_5 \geq 20$ nm, wherein $L_5$ is a distance from said fifth layer to a well layer at the substrate side in said active layer.

24. The nitride semiconductor light emitting element according to claim 22, wherein
said second layer and said fifth layer are different in impurity concentration.

25. The nitride semiconductor light emitting element according to claim 9, further comprising
a seventh layer formed of a nitride semiconductor mainly containing In and Ga on and adjacent to said active layer.

26. A method for manufacturing a nitride semiconductor light emitting element including a substrate, a lower clad layer formed of a nitride semiconductor containing Al and Ga stacked thereon, a lower guide layer formed of a nitride semiconductor mainly containing In and Ga stacked thereon, and an active layer including a nitride semiconductor mainly containing In and Ga stacked thereon, said lower guide layer having a first layer and a second layer higher in In content than said first layer successively stacked from the active layer side, wherein $\Delta T \leq 80°$ C., wherein $\Delta T$ is variation in growth temperature from initiation of growth of said lower guide layer to initiation of growth of said active layer.

27. A method for manufacturing a nitride semiconductor light emitting element including a substrate, a lower clad layer formed of a nitride semiconductor containing Al and Ga stacked thereon, a lower guide layer formed of a nitride semiconductor mainly containing In and Ga stacked thereon, and an active layer including a nitride semiconductor mainly containing In and Ga stacked thereon, said lower guide layer having a first layer and a second layer higher in In content than said first layer successively stacked from the active layer side, wherein
growth temperature of each layer from initiation of growth of said lower guide layer to initiation of growth of said active layer is at most 830° C.

28. A method for manufacturing a nitride semiconductor light emitting element including a substrate, a lower clad layer formed of a nitride semiconductor containing Al and Ga stacked thereon, a lower guide layer formed of a nitride semiconductor mainly containing In and Ga stacked thereon, and an active layer including a nitride semiconductor mainly containing In and Ga stacked thereon, said lower guide layer having a first layer, a second layer higher in In content than said first layer and functioning as a saturable absorption layer, and a third layer lower in In content than said second layer successively stacked from the active layer side, said third layer surrounding a fourth layer higher in In content than said third layer, wherein $T_4 \leq T_2$, wherein $T_2$ is growth temperature of said second layer and $T_4$ is growth temperature of said fourth layer.

29. A method for manufacturing a nitride semiconductor light emitting element including a substrate, a lower clad layer formed of a nitride semiconductor containing Al and Ga stacked thereon, a lower guide layer formed of a nitride semiconductor mainly containing In and Ga stacked thereon, and an active layer including a nitride semiconductor mainly containing In and Ga stacked thereon, said lower guide layer having a first layer and a second layer higher in In content than said first layer and functioning as a saturable absorption layer successively stacked from the active layer side, said lower guide layer further having a fifth layer and a sixth layer successively stacked from the active layer side between said first layer and said second layer, said fifth layer being higher in In content than said first layer, and said sixth layer being lower in In content than said fifth layer and said second layer, wherein $T_5 \leq T_2$, wherein $T_2$ is growth temperature of said second layer and $T_5$ is growth temperature of said fifth layer.

30. A method for manufacturing a nitride semiconductor light emitting element including a substrate, a lower clad layer formed of a nitride semiconductor containing Al and Ga stacked thereon, a lower guide layer formed of a nitride semiconductor mainly containing In and Ga stacked thereon, and an active layer including a nitride semiconductor mainly containing In and Ga stacked thereon, said lower guide layer having a first layer and a second layer higher in In content than said first layer and functioning as a saturable absorption layer successively stacked from the active layer side, wherein
at least one interface at which growth interruption is introduced is located in a range of $0$ nm $\leq L_4 \leq 20$ nm, wherein $L_4$ is a distance between said interface and the second layer.

31. The method for manufacturing a nitride semiconductor light emitting element according to claim 30, wherein
temperature variation of said substrate occurs at least once during said growth interruption.

* * * * *